United States Patent
Ebihara et al.

(10) Patent No.: US 11,804,555 B2
(45) Date of Patent: Oct. 31, 2023

(54) SEMICONDUCTOR DEVICE AND POWER CONVERSION DEVICE

(71) Applicant: Mitsubishi Electric Corporation, Tokyo (JP)

(72) Inventors: Kohei Ebihara, Tokyo (JP); Shiro Hino, Tokyo (JP); Kosuke Miyazaki, Tokyo (JP); Yasushi Takaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 333 days.

(21) Appl. No.: 17/288,916

(22) PCT Filed: Jan. 29, 2019

(86) PCT No.: PCT/JP2019/002855
§ 371 (c)(1),
(2) Date: Apr. 27, 2021

(87) PCT Pub. No.: WO2020/157815
PCT Pub. Date: Aug. 6, 2020

(65) Prior Publication Data
US 2021/0399144 A1    Dec. 23, 2021

(51) Int. Cl.
*H01L 29/87* (2006.01)
*H01L 29/872* (2006.01)
(Continued)

(52) U.S. Cl.
CPC ........ *H01L 29/872* (2013.01); *H01L 29/1608* (2013.01); *H01L 29/7802* (2013.01); *H02M 7/53871* (2013.01)

(58) Field of Classification Search
CPC ............... H01L 29/872; H01L 29/1608; H01L 29/7802
See application file for complete search history.

(56) References Cited

U.S. PATENT DOCUMENTS

2010/0244199 A1\* 9/2010 Sakuma .................. H01L 21/78
257/618
2015/0001554 A1  1/2015 Imai
(Continued)

FOREIGN PATENT DOCUMENTS

JP  2007-103524 A   4/2007
JP  2009-224642 A   10/2009
(Continued)

OTHER PUBLICATIONS

International Search Report and Written Opinion dated Apr. 2, 2019, received for PCT Application PCT/JP2019/002855, Filed on Jan. 29, 2019, 10 pages including English Translation.
(Continued)

*Primary Examiner* — Adolf D Berhane
*Assistant Examiner* — Afework S Demisse
(74) *Attorney, Agent, or Firm* — XSENSUS LLP

(57) ABSTRACT

The present invention relates to a semiconductor device, wherein the semiconductor substrate includes: a semiconductor layer; and a well region, the semiconductor device includes: a surface electrode provided on a second main surface on a side opposite to a first main surface; a back surface electrode provided on the first main surface; and an upper surface film covering an end edge portion of the surface electrode and at least part of an outer side region outside an end surface of the surface electrode of the semiconductor substrate, the well region includes a portion extending to the outer side region and a portion extending to an inner side region inside the end surface of the surface electrode, and the upper surface film includes at least one outer peripheral opening part provided along an outer periphery of the surface electrode away from the surface electrode of the outer side region.

13 Claims, 30 Drawing Sheets

(51) Int. Cl.
*H01L 29/16* (2006.01)
*H01L 29/78* (2006.01)
*H02M 7/5387* (2007.01)

(56) References Cited

U.S. PATENT DOCUMENTS

| | | | |
|---|---|---|---|
| 2016/0276448 | A1 | 9/2016 | Ohara et al. |
| 2017/0271443 | A1 | 9/2017 | Ohara |
| 2018/0374795 | A1* | 12/2018 | Deguchi ................. H01L 24/05 |
| 2020/0194554 | A1 | 6/2020 | Adachi et al. |

FOREIGN PATENT DOCUMENTS

| | | |
|---|---|---|
| JP | 2013-152982 A | 8/2013 |
| JP | 2013-211503 A | 10/2013 |
| JP | 2016-171272 A | 9/2016 |
| JP | 2017-168669 A | 9/2017 |
| WO | 2015/052782 A1 | 4/2015 |
| WO | 2017/149743 A1 | 9/2017 |
| WO | 2018/163593 A1 | 9/2018 |

OTHER PUBLICATIONS

Office Action dated Jul. 6, 2022 in German Patent Application No. 11 2019 006 756.7, 12 pages.

* cited by examiner

F I G. 3
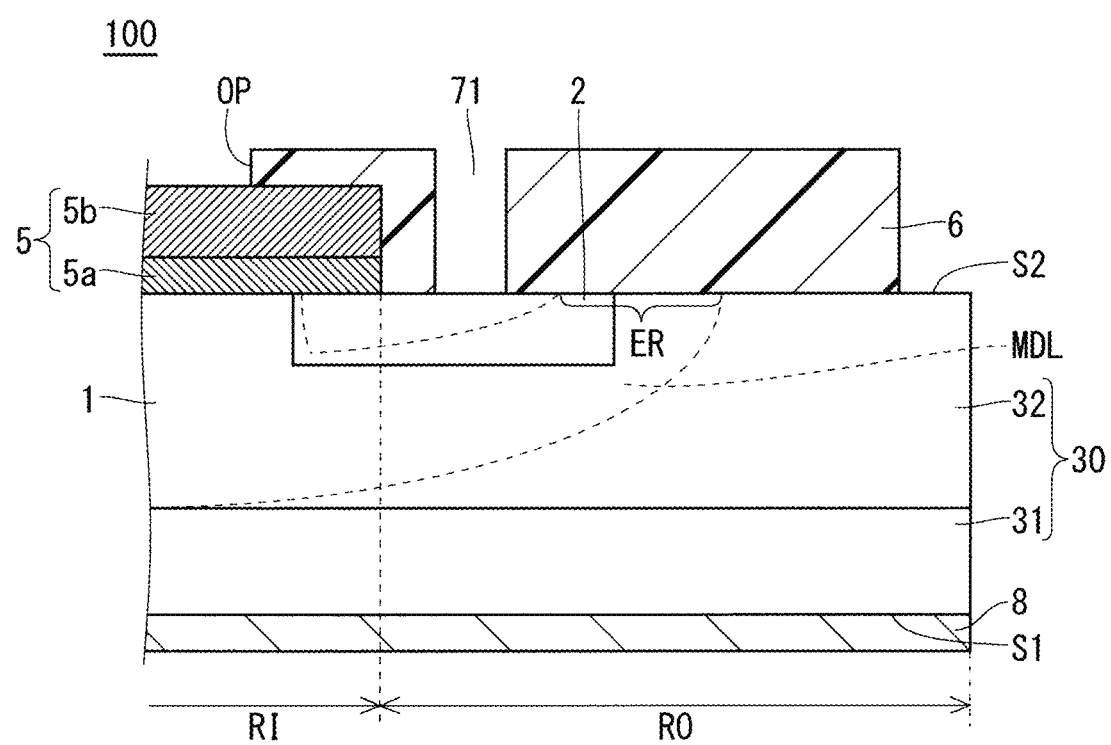

F I G. 7
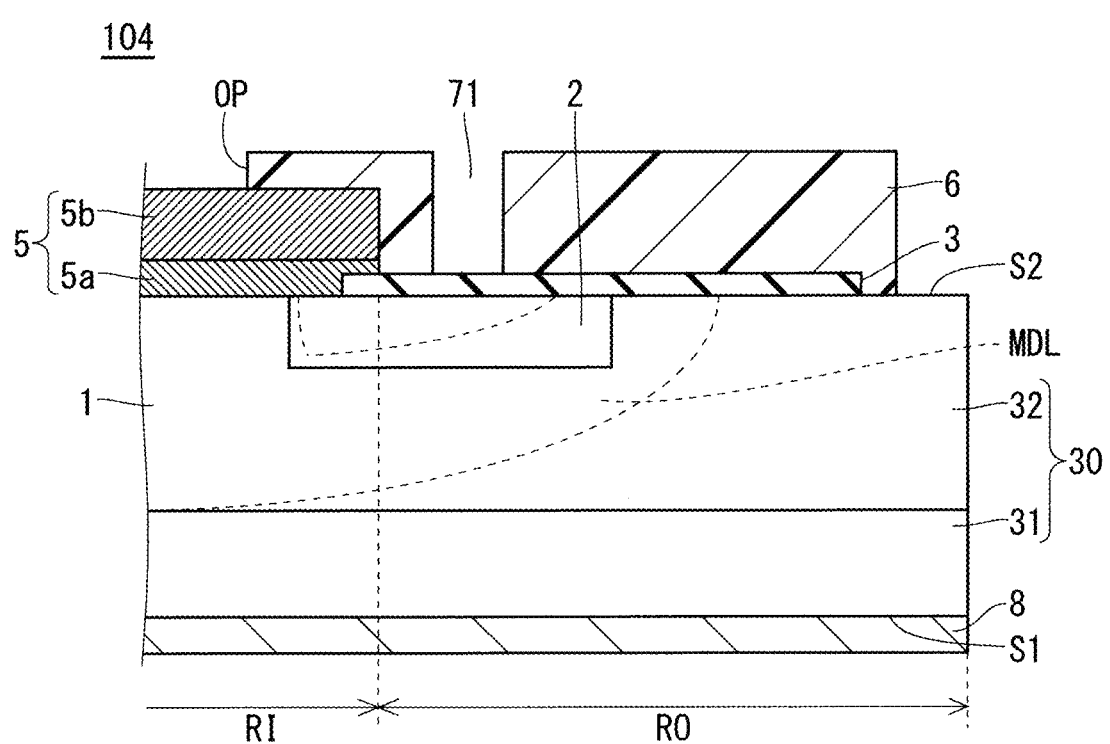

F I G. 8
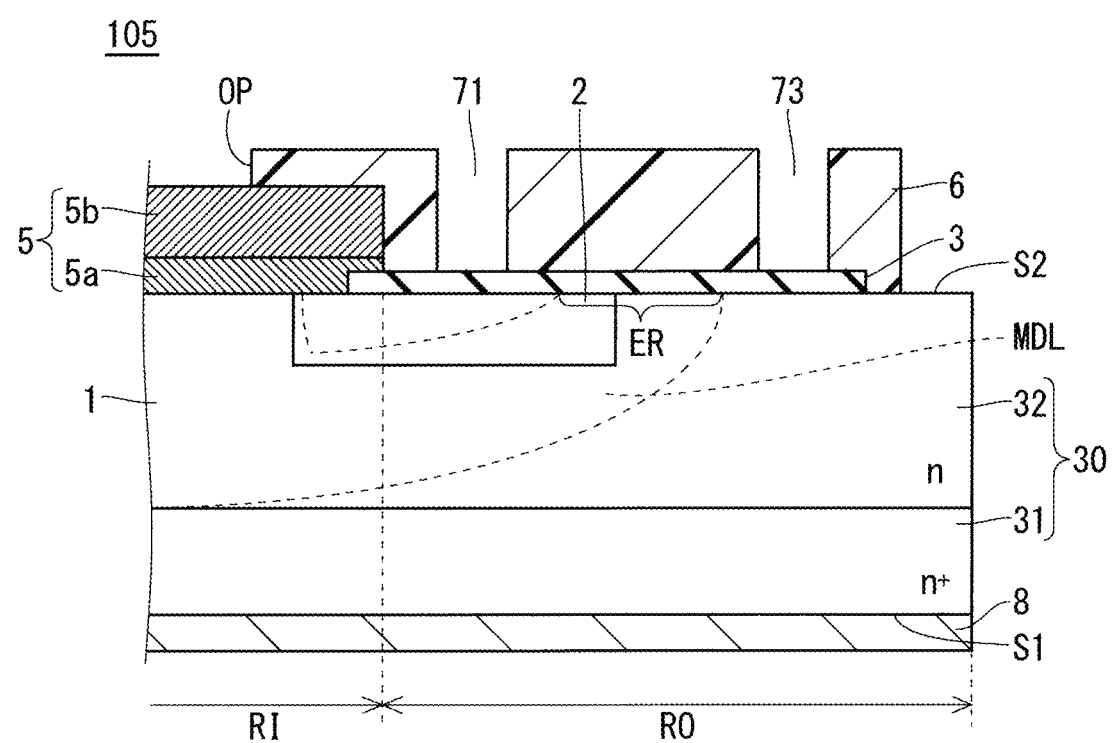

SEMICONDUCTOR DEVICE AND POWER CONVERSION DEVICE

CROSS-REFERENCE TO RELATED APPLICATION

The present application is based on PCT filing PCT/JP2019/002855, filed Jan. 29, 2019, the entire contents of which are incorporated herein by reference.

TECHNICAL FIELD

The present invention relates to a semiconductor device, and particularly to a semiconductor device having a surface protection film.

BACKGROUND ART

Known for securing withstand voltage in a vertical semiconductor device used for a power device, for example, is that a p-type guard ring region (terminal well region) is provided in a so-called terminal region in an n-type semiconductor layer as disclosed in Patent Document 1, for example.

When the guard ring region is provided, a depletion layer formed by a pn junction between the semiconductor layer and the guard ring region reduces an electrical field occurring at a time when reverse voltage is applied to a main electrode of the semiconductor device. In a Schottky barrier diode (SBD) described in Patent Document 1 described above, part of a surface electrode other than a region on which a wire bonding is performed is covered by polyimide as a surface protection film. The part thereof is sealed by a sealing material such as gel in some cases. Such a surface protection film and sealing resin can be applied not only to the SBD but also to the other semiconductor device such as a metal oxide semiconductor field effect transistor (MOSFET).

PRIOR ART DOCUMENTS

Patent Documents

Patent Document 1: Japanese Patent Application Laid-Open No. 2013-211503

SUMMARY

Problem to be Solved by the Invention

The surface protection film of polyimide and the sealing material such as gel, for example, tend to include moisture under high humidity. This moisture may have a negative effect on the surface electrode. Specifically, the surface electrode may be transferred into the moisture or the moisture and the surface electrode are reacted with each other, thereby causing a deposition reaction of an insulating material in some cases. In such a case, the surface protection film tends to be peeled at an interface between the surface protection film and a layer located below the surface protection film. There is a possibility that a cavity between the surface electrode and the surface protection film formed by the peeling acts as a leak path, and insulation reliability of the semiconductor device is diminished.

The present invention therefore has been made to solve problems as described above, and it is an object of the present invention to provide a semiconductor device in which insulation reliability is increased.

Means to Solve the Problem

A semiconductor device according to the present invention is a semiconductor device in which a main current flows in a thickness direction of a semiconductor substrate, wherein the semiconductor substrate includes: a semiconductor layer of a first conductivity type; and a well region of a second conductivity type, which is different from the first conductivity type, provided on an upper layer portion of the semiconductor layer, the semiconductor device includes: a surface electrode provided on a second main surface on a side opposite to a first main surface; a back surface electrode provided on the first main surface; and an upper surface film covering an end edge portion of the surface electrode and at least part of an outer side region outside an end surface of the surface electrode of the semiconductor substrate, the well region includes a portion extending to the outer side region and a portion extending to an inner side region inside the end surface of the surface electrode, the surface electrode covers at least part of the inner side region and is electrically connected to the well region, the upper surface film includes at least one outer peripheral opening part provided along an outer periphery of the surface electrode away from the surface electrode of the outer side region, and the at least one outer peripheral opening part is provided inside an outer end surface of the well region.

Effects of the Invention

According to the semiconductor device of the present invention, an extension of peeling beyond the outer peripheral opening part is suppressed even in a case where an insulating material is deposited on the surface electrode and the upper surface film is peeled, thus insulation reliability of the semiconductor device can be increased.

BRIEF DESCRIPTION OF DRAWINGS

FIG. 3 A partial cross-sectional view schematically illustrating a distribution of a maximum depletion layer.

FIG. 7 A partial cross-sectional view illustrating a configuration of a modification example 4 of the semiconductor device of the embodiment 1 according to the present invention.

FIG. 8 A partial cross-sectional view illustrating a configuration of a modification example 5 of the semiconductor device of the embodiment 1 according to the present invention.

DESCRIPTION OF EMBODIMENT(S)

Introduction

Figure 1:
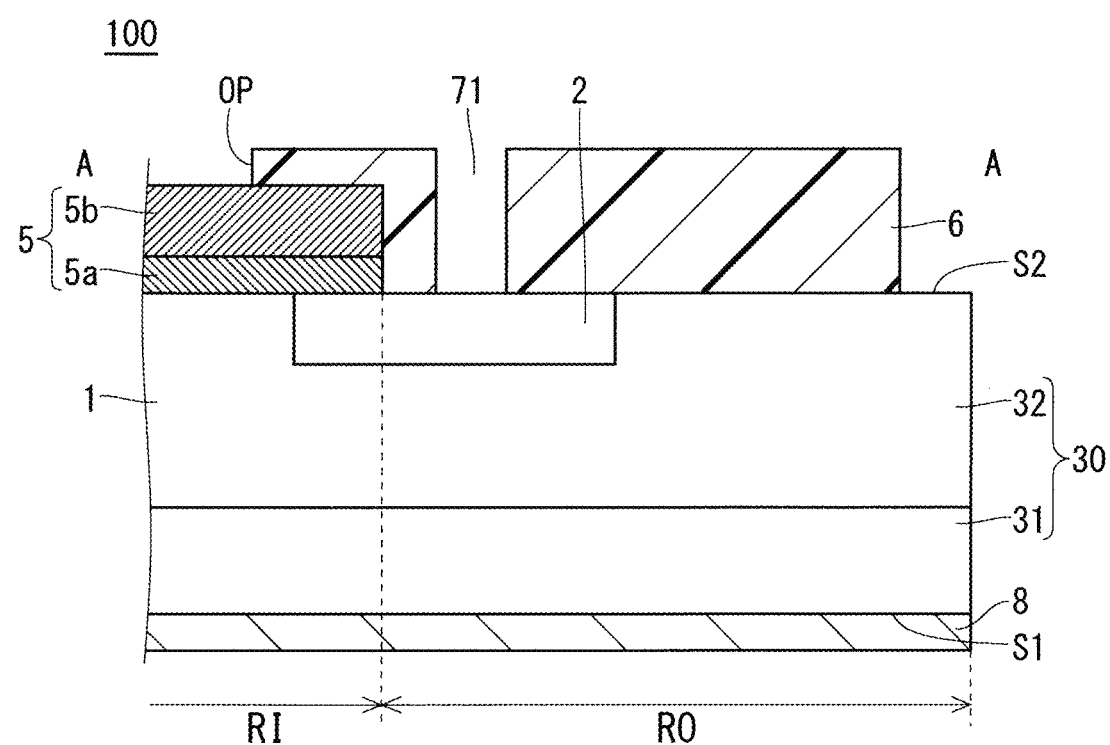
FIG. 1 A partial cross-sectional view illustrating a configuration of a semiconductor device of an embodiment 1 according to the present invention.

In the description hereinafter, "an active region" is a region in which a main current flows when a semiconductor device is in an ON state, and "a terminal region" is a region around the active region. In the description, "an outer side" is a direction toward an outer periphery of the semiconductor device, and "an inner side" is a direction opposite to "the outer side". In the description hereinafter, with respect to a conductivity type of an impurity, an n type is generally defined as "a first conductivity type" and a p type which is a conductivity type opposite to the n type is defined as "a second conductivity type", however, a reverse definition is also applicable.

The drawings are schematically illustrated, thus a size of an image and a mutual relationship of positions thereof are not necessarily illustrated accurately, but can be appropriately changed. In the description hereinafter, the same reference numerals are assigned to the similar constituent elements in the illustration, and the same applies to names and functions thereof. Thus, a detailed description thereof may be omitted in some cases. When there is descriptions of "on . . . " and "cover . . . " in the present specification, they does not hinder presence of an intervening object between the constituent elements. For example, when there is a description of "B provided on A" or "A covers B", it can mean that the other constituent element C is provided or is not provided between A and B. Used in the description hereinafter are terms each indicating a specific position and direction such as "upper side", "lower side", "lateral side", "bottom", "front", and "back", for example, however, these terms are used for convenience of easy understanding of contents of the embodiments, and do not relate to a direction in an actual use.

A term of "MOS" is formerly used for a junction structure of metal-oxide-semiconductor, and is considered to be made up of initials of Metal-Oxide-Semiconductor. However, specifically in a field-effect transistor having a MOS structure (simply referred to as "the MOS transistor" hereinafter), materials of a gate insulating film and a gate electrode are improved from a viewpoint of a recent integration and improvement of a manufacturing process.

For example, in the MOS transistor, polycrystal silicon is adopted as a material of a gate electrode in place of metal from a viewpoint of a formation of mainly a source and drain in a self-aligned form. A high-dielectric constant material is adopted as the material of the gate insulating film from a viewpoint of improvement of electrical characteristics, however, the material is not necessarily limited to oxide.

Accordingly, the term of "MOS" is not necessarily adopted only to a lamination structure of metal-oxide-semiconductor, and the present specification is not based on such a premise. That is to say, in view of a technical common knowledge, "MOS" herein has a meaning of not only an abbreviated word derived from an origin of a word but also widely includes a lamination structure of conductive body-insulating body-semiconductor.

Embodiment 1

A semiconductor device of an embodiment 1 according to the present invention is described hereinafter with reference to FIG. 1 to FIG. 16.

Configuration of Device

Figure 2:
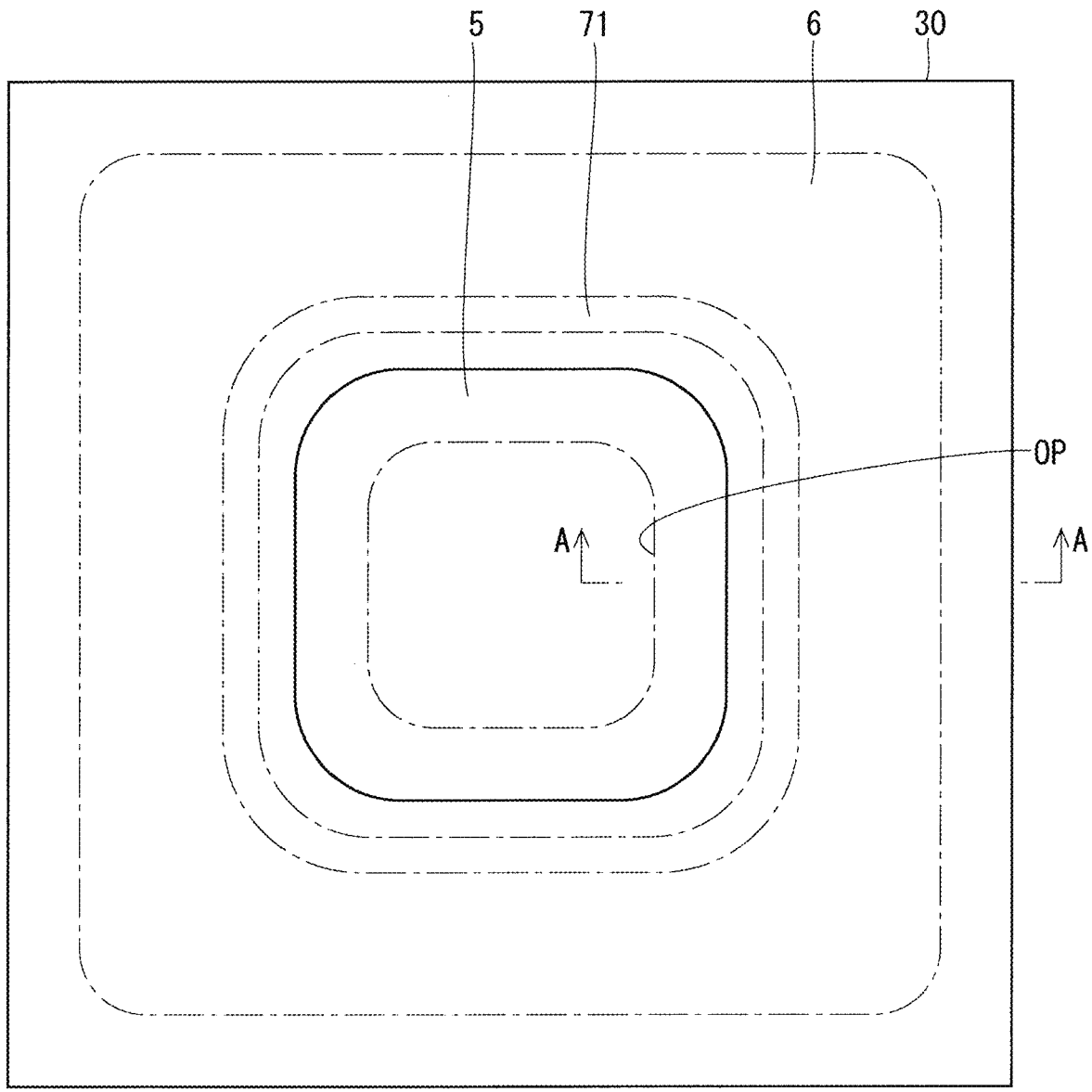
FIG. 2 A plan view illustrating the configuration of the semiconductor device of the embodiment 1 according to the present invention.

FIG. 1 is a partial cross-sectional view illustrating a configuration of an SBD 100 (semiconductor device) of the embodiment 1 according to the present invention, and FIG. 2 is a plan view illustrating the configuration of the SBD 100. A cross-sectional view along an A-A line in an arrow direction in FIG. 2 corresponds to FIG. 1. In FIG. 2, a surface protection film 6 (an upper surface film) in an upper surface configuration of the SBD 100 is omitted for convenience, and the surface protection film 6 and an outer peripheral opening part 71 of the surface protection film 6 are indicated by a broken line. In FIG. 1, a right side is a terminal region of the SBD 100 and a left side is an active region in which a main current flows in an ON state of the SBD 100.

The SBD 100 includes an epitaxial substrate 30 (semiconductor substrate), a back surface electrode 8 (a first main electrode), a surface electrode 5 (a second main electrode), and a surface protection film 6. In the present embodiment, the epitaxial substrate 30 is a silicon carbide (SiC) substrate having a polytype of 4H, and the SBD 100 is an SiC-SBD.

The epitaxial substrate 30 has a back surface S1 (a first main surface) and a front surface S2 (a second main surface) on a side opposite to the back surface S1.

The surface electrode 5 and the surface protection film 6 are provided on the front surface S2, and an inner side in relation to an end surface of the surface electrode 5 is defined as an inner side region RI and an outer side is defined as an outer side region RO. The back surface electrode 8 is provided on the back surface S1.

The epitaxial substrate 30 includes an n-type (first conductivity type) single crystal substrate 31 (support substrate) made of SiC and an epitaxial layer 32 (semiconductor layer) formed on the single crystal substrate 31. The epitaxial layer 32 is an SiC layer (silicon carbide layer).

The epitaxial layer 32 is mainly a drift layer 1 in which current flows by drift except for a p-type (second conductivity type) terminal well region 2 (well region) selectively provided in an upper layer portion of the epitaxial layer 32. The terminal well region 2 is also referred to as a guard ring region.

The drift layer 1 has the same n-type conductivity type as that of the single crystal substrate 31 in the present embodiment. An impurity concentration of the drift layer 1 is lower than that of the single crystal substrate 31. Thus, the single crystal substrate 31 has a lower resistivity than the drift layer 1. The impurity concentration of the drift layer 1 is equal to or larger than $1\times10^{14}/cm^3$ and equal to or smaller than $1\times10^{17}/cm^3$.

The terminal well region 2 has a portion extending to the inner side region RI and the outer side region RO from a boundary between the inner side region RI and the outer side region RO in the upper layer portion of the epitaxial layer 32. In other words, the terminal well region 2 is provided across the boundary between the inner side region RI and the outer side region RO. The terminal well region 2 may have a plurality of regions with different impurity concentrations such as a high concentration region and a low concentration region. It is also applicable that the p-type impurity region which is the same type as that of the terminal well region 2 is provided in a looped form to surround the terminal well region 2 in the upper layer portion of the epitaxial layer 32 on the outer periphery of the terminal well region 2. The number of the impurity regions is not limited to one, however, two or more impurity regions may be provided in a looped form.

The surface electrode 5 is provided on at least part of the front surface S2 of the inner side region RI in the epitaxial substrate 30. In the present embodiment, the surface electrode 5 is provided over the whole inner side region RI, and is not provided in the outer side region RO. The surface electrode 5 includes a Schottky electrode 5a provided on the front surface S2 of the epitaxial substrate 30 and an electrode pad 5b provided on the Schottky electrode 5a.

The Schottky electrode 5a has contact with the inner side region RI in the front surface S2, and specifically has contact with the drift layer 1 and the terminal well region 2. Accordingly, the surface electrode 5 is electrically connected to the terminal well region 2. Metal forming a Schottky junction with the n-type SiC semiconductor is applicable as a material of the Schottky electrode 5a in the present embodiment, and titanium (Ti), molybdenum (Mo), nickel (Ni), gold (Au), or tungsten (W), for example, can be used. A thickness of the Schottky electrode 5a is preferably equal to or larger than 30 nm and equal to or smaller than 300 nm, and is made up of a Ti film having a thickness of 100 nm, for example.

Metal including aluminum (Al), copper (Cu), Mo, or Ni or Al alloy such as Al—Si (silicon) can be used as a material of the electrode pad 5b. A thickness of the electrode pad 5b is preferably equal to or larger than 300 nm and equal to or smaller than 10 μm, and is made up of an Al film having a thickness of 3 μm, for example.

The surface protection film 6 is provided to cover an end edge portion of the surface electrode 5, and specifically covers a range from an upper surface end portion of the electrode pad 5b to an end surface of the electrode pad 5b and an end surface of the Schottky electrode 5a. Thus, an outer peripheral portion of the upper surface of the electrode pad 5b is covered by the surface protection film 6. The surface protection film 6 covers at least part of the outer side region RO in the epitaxial substrate 30. The surface protection film 6 has an opening part OP in a center portion of the electrode pad 5b, that is to say, a left side portion in FIG. 1 so that the electrode pad 5b can function as an external terminal.

The surface protection film 6 has an outer peripheral opening part 71 reaching the front surface S2 of the epitaxial substrate 30 in a position away from the surface electrode 5 in the outer side region RO. The outer peripheral opening part 71 is preferably provided to be located on the terminal well region 2, and is continuously provided in a looped form to surround the surface electrode 5 as illustrated in FIG. 2.

It is preferable that the surface protection film 6 is made up of an insulating material and is resin such as polyimide, for example, to reduce stress from outside.

FIG. 3 is a cross-sectional view schematically illustrating an example of a distribution of a maximum depletion layer MDL which is a depletion layer extending from the boundary between the drift layer 1 and the terminal well region 2 when maximum voltage (described hereinafter) is applied to the SBD 100. As illustrated in FIG. 3, it is preferable that the outer peripheral opening part 71 is provided on an inner side away from a region ER where the maximum depletion layer MDL reaches (is exposed to) the front surface S2 of the epitaxial substrate 30, that is to say, the left side in FIG. 3.

In the above description, the epitaxial substrate 30 is made up of SiC. SiC has a wider band gap than Si, and the SiC semiconductor device using SiC is excellent in pressure resistance, and has a high allowable current density and heat resistance compared with the Si semiconductor device using Si, thus can be operated under high temperature.

The material is not limited to SiC, however, the epitaxial substrate 30 may also be made up of the other wide band gap semiconductor such as gallium nitride (GaN), for example. Silicon (Si), for example, may also be used in place of the wide band gap semiconductor. The semiconductor device may be a diode other than the SBD, and may also be a pn junction diode or a junction barrier Schottky (JBS) diode, for example.

Modification Example 1

Figure 4:
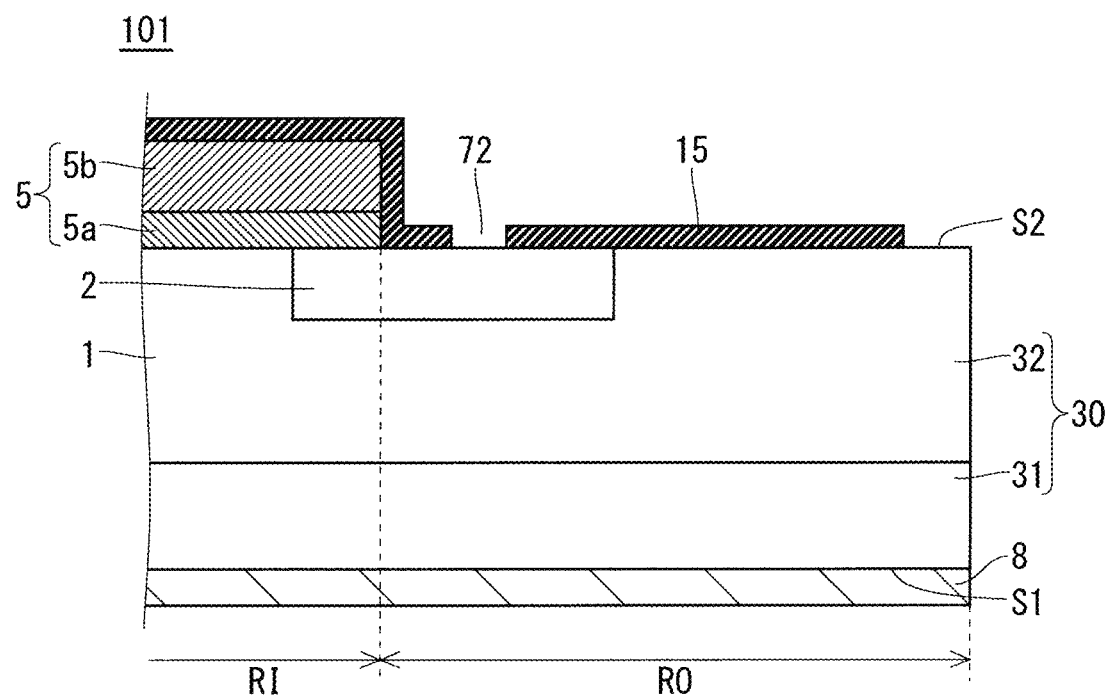
FIG. 4 A partial cross-sectional view illustrating a configuration of a modification example 1 of the semiconductor device of the embodiment 1 according to the present invention.

FIG. 4 is a cross-sectional view illustrating a configuration of an SBD 101 in a modification example 1 of the embodiment 1, and is a drawing corresponding to FIG. 1. As illustrated in FIG. 4, the SBD 101 has a high resistance film 15 (upper surface film) in place of the surface protection film 6 illustrated in FIG. 1. That is to say, the high resistance film 15 is provided to cover a range from the upper surface end portion of the electrode pad 5b to the end surface of the Schottky electrode 5a, and cover at least part of the outer side region RO in the epitaxial substrate 30.

The high resistance film 15 has an outer peripheral opening part 72 reaching the front surface S2 of the epitaxial substrate 30 in a position away from the surface electrode 5 in the outer side region RO. The outer peripheral opening part 72 is preferably provided to be located on the terminal well region 2. A material of the high resistance film 15 preferably has a resistivity equal to or larger than $10 \times 10^{12}$ Ωcm, and SiN is used as the material thereof. A thickness of the high resistance film 15 is equal to or larger than 100 nm, for example.

Modification Example 2

Figure 5:
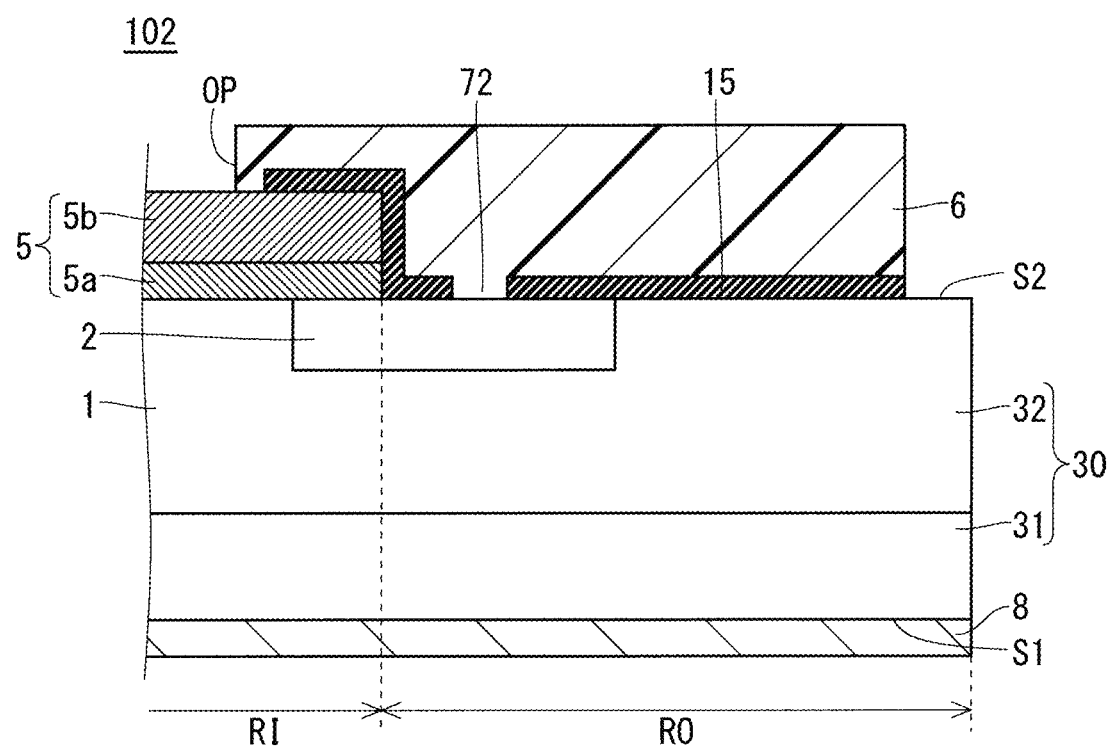
FIG. 5 A partial cross-sectional view illustrating a configuration of a modification example 2 of the semiconductor device of the embodiment 1 according to the present invention.

FIG. 5 is a cross-sectional view illustrating a configuration of an SBD 102 in a modification example 2 of the embodiment 1, and is a drawing corresponding to FIG. 1. As illustrated in FIG. 5, the SBD 102 further includes the surface protection film 6 provided to cover the high resistance film 15 of the SBD 101 illustrated in FIG. 4.

The surface protection film 6 is provided to cover a range from the upper surface end portion of the electrode pad 5b to an upper portion of the high resistance film 15 and cover at least part of the outer side region RO in the epitaxial substrate 30. It is also applicable that the surface protection film 6 does not completely cover the high resistance film 15, thus an end edge portion of the high resistance film 15 is exposed on the electrode pad 5b, an end edge portion of the high resistance film 15 is exposed on the epitaxial substrate 30, and an end edge portion of the high resistance film 15 is exposed on both the electrode pad 5b and the epitaxial substrate 30.

In FIG. 5, the outer peripheral opening part 72 of the high resistance film 15 is provided to be embedded, however, it is also applicable that the outer peripheral opening part 71 (FIG. 1) passing through the surface protection film 6 to reach the outer peripheral opening part 72 is provided in a portion corresponding to the outer peripheral opening part 72, or the outer peripheral opening part 72 is not provided in the high resistance film 15 but only the outer peripheral opening part 71 (FIG. 1) passing through the surface protection film 6 to reach the high resistance film 15 is provided therein. When both the outer peripheral opening part 71 and the outer peripheral opening part 72 are provided, they may be provided in positions different from each other.

Modification Example 3

Figure 6:
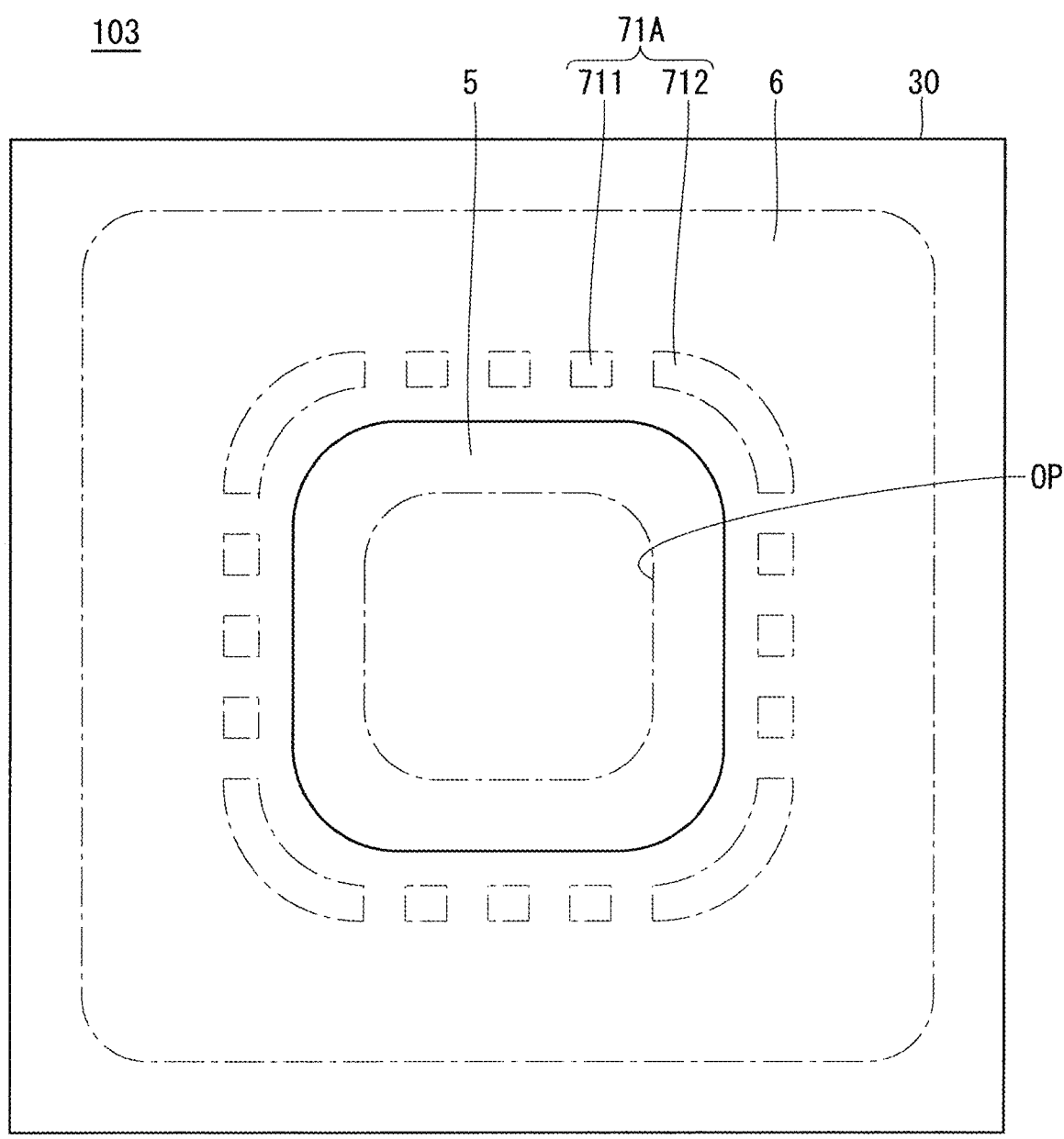
FIG. 6 A plan view illustrating a configuration of a modification example 3 of the semiconductor device of the embodiment 1 according to the present invention.

FIG. 6 is a plan view illustrating a configuration of an SBD 103 in a modification example 3 of the embodiment 1, and is a drawing corresponding to FIG. 2. As illustrated in FIG. 6, in the SBD 103, an outer peripheral opening part 71A provided to surround the surface electrode 5 is made up of a plurality of partial opening parts 711 and 712 which do not constitute a continuous opening part but are separated from each other. That is to say, the rectangular partial opening part 711 is provided in a straight portion along each side of the surface electrode 5, and the curved partial opening part 712 having a curvature is provided in a portion along a corner portion of the surface electrode 5, thereby having a configuration that the outer peripheral opening part 71A does not completely surround the surface electrode 5. In other words, in the outer peripheral opening part 71 having a looped shape to completely surround the surface electrode 5 as illustrated in FIG. 2, a portion between an inner periphery and an outer periphery of the loop is embedded by the surface protection film 6 at one or more positions.

Herein, a portion which is not an opening part but is provided with the surface protection film 6 such as a portion between the partial opening parts 711 and a portion between the partial opening part 711 and the partial opening part 712 illustrated in FIG. 6 is defined as "a continuous region". It is preferable that the continuous region is not provided but the partial opening part 712 is provided in the portion along the corner portion of the surface electrode 5 having the curvature in a plan view. A reason of this is described hereinafter.

Modification Example 4

FIG. 7 is a cross-sectional view illustrating a configuration of an SBD 104 in a modification example 4 of the embodiment 1, and is a drawing corresponding to FIG. 1. As illustrated in FIG. 7, the SBD 104 has a field insulating film 3 (insulating film) provided on the front surface S2 of the epitaxial layer 32. That is to say, the field insulating film 3 is provided to extend from the boundary between the inner side region RI and the outer side region RO to the inner side region RI and also extend to the outer side region RO on the epitaxial layer 32. Part of the field insulating film 3 on a side of the inner side region RI extends below an end edge portion of the Schottky electrode 5a, thus part of the Schottky electrode 5a and the electrode pad 5b is located thereon. Part of the field insulating film 3 on a side of the outer side region RO extends beyond an end portion of the terminal well region 2 in the outer side region RO.

The surface protection film 6 is provided to cover a range from the upper surface end portion of the electrode pad 5b to the end surface of the Schottky electrode 5a, and cover at least part of the field insulating film 3 and the outer side region RO in the epitaxial substrate 30.

The surface protection film 6 has the outer peripheral opening part 71 reaching the field insulating film 3 in a position away from the surface electrode 5 in the outer side region RO. The position of the outer peripheral opening part 71 is the same as that in FIG. 1.

A material of the field insulating film 3 is an insulating material such as $SiO_2$ or SiN, for example. It is preferably formed to have a thickness of 10 nm or more, and is formed of an $SiO_2$ film having a thickness of 1 μm, for example.

Modification Example 5

FIG. 8 is a cross-sectional view illustrating a configuration of an SBD 105 in a modification example 5 of the embodiment 1, and is a drawing corresponding to FIG. 1. As illustrated in FIG. 8, the SBD 105 has an outer peripheral opening part 73 (first outer peripheral opening part) provided inside an outer end surface of the field insulating film 3 in the surface protection film 6 in addition to the outer peripheral opening part 71 (first outer peripheral opening part) of the SBD 104 described using FIG. 7.

FIG. 8 schematically illustrates an example of a distribution of the maximum depletion layer MDL which is a depletion layer extending from the boundary between the drift layer 1 and the terminal well region 2 when maximum voltage (described hereinafter) is applied to the SBD 105. As illustrated in FIG. 8, the outer peripheral opening part 73 is preferably provided on an outer side, that is to say, the right side in FIG. 8 away from the region ER where the maximum depletion layer MDL reaches (is exposed to) the front surface S2 of the epitaxial substrate 30.

Operation

An operation of the SBD 100 of the embodiment 1 described using FIG. 1 is described next. When negative voltage is applied to the back surface electrode 8 based on potential of the electrode pad 5b of the surface electrode 5, the SBD 100 which is an SiC-SBD enters a state where current flows from the surface electrode 5 to the back surface electrode 8, that is to say, a conduction state (ON state). In contrast, when positive voltage is applied to the back surface electrode 8 based on the surface electrode 5, the SBD 100 enters a blocking state (OFF state).

With reference to FIG. 3, when the SBD 100 is in the OFF state, large electrical field is applied to a surface of an active region in the drift layer 1 and an area near a pn junction interface between the drift layer 1 and the terminal well region 2. Voltage applied to the back surface electrode 8 at a time when the electrical field reaches a critical electrical field and avalanche breakdown occurs is defined as maximum voltage (avalanche voltage). Normally, rated voltage is determined so that the SBD 100 is used within a voltage range in which the avalanche breakdown does not occur.

In the OFF state, the depletion layer expands in a direction (lower direction) toward the single crystal substrate 31 and an outer peripheral direction (right direction) of the drift layer 1 from the surface of the active region in the drift layer 1 and the pn junction interface between the drift layer 1 and the terminal well region 2. The depletion layer also expands from the pn junction interface between the drift layer 1 and the terminal well region 2 into the terminal well region 2, and a degree of the expansion significantly depends on the concentration of the terminal well region 2. That is to say, when the concentration of the terminal well region 2 increases, the expansion of the depletion layer is suppressed in the terminal well region 2, and a position of an edge of the depletion layer is located near the boundary between the terminal well region 2 and the drift layer 1.

Herein, a position indicated by two broken lines in FIG. 3 is a position of an edge of the maximum depletion layer MDL. The position of the edge of the maximum depletion layer MDL can be checked by technology CAD (TCAD), for example. At this time, a potential difference occurs from an outer peripheral side of the epitaxial layer 32 toward a center in a depleted region in the epitaxial layer 32.

Considered herein is a case where the SBD 100 is in the OFF state under high humidity. The surface protection film 6 has high water absorption properties, thus contains a large amount of moisture under high humidity. This moisture reaches the surfaces of the epitaxial layer 32 and the electrode pad 5b. An end edge portion of the drift layer 1 acts as a positive electrode by voltage applied to the SBD 100 in the OFF state, and the electrode pad 5b acts as a negative electrode. A reduction reaction of oxygen expressed by the following chemical formula (1) and a formation reaction of hydrogen expressed by the following chemical formula (2) occur in the moisture described above near the electrode pad 5b which becomes the negative electrode.

$$O_2 + 2H_2O + 4e^- \rightarrow 4OH^- \tag{1}$$

$$H_2O + e^- \rightarrow OH^- + \tfrac{1}{2}H_2 \tag{2}$$

According to these reactions, a concentration of hydroxide ion increases near the electrode pad 5b. Hydroxide ion chemically reacts with the electrode pad 5b. For example, when the electrode pad 5b is made of aluminum, aluminum is changed into aluminum hydroxide by the chemical reaction described above in some cases. Aluminum hydroxide is deposited as an insulating material on the surface of the electrode pad 5b. When the epitaxial substrate 30 is made of SiC, a width of the terminal well region 2 and a width from the terminal well region 2 to the end edge portion of the drift layer 1 can be designed to be small by using a high insulating breakdown electrical field of SiC.

In such a design, a distance from the end edge portion of the drift layer 1 which becomes the positive electrode in the OFF state to the electrode pad 5b which becomes the negative electrode decreases. Thus, a high electrical field occurs near the electrode pad 5b and the chemical reaction is promoted, thus the concentration of hydroxide ion further increases. Thus, the insulating material is deposited more significantly on the surface of the electrode pad 5b.

At this time, the insulating material is deposited on an upper surface and a lateral surface of the electrode pad 5b in the end edge portion (a right end in FIG. 3) of the electrode pad 5b. The surface protection film 6 is pushed up by the deposition, and as a result, the surface protection film 6 is peeled at an interface between the electrode pad 5b and the surface protection film 6 in some cases.

The peeling of the surface protection film 6 extends on the epitaxial layer 32 in some cases. In other words, the surface protection film 6 is also peeled at an interface between the epitaxial layer 32 and the surface protection film 6. If a cavity portion is formed on the terminal well region 2 by this peeling, moisture enters the cavity portion and causes an excess leakage current or an aerial discharge occurs in the cavity portion, thus an element breakdown occurs in the SBD 100 in some cases.

However, in the SBD 100 of the present embodiment 1, the outer peripheral opening part 71 continuously formed into the looped form is provided outside the electrode pad 5b. Accordingly, even if the peeling of the surface protection film 6 occurs from the end edge portion of the electrode pad 5b to the end edge portion of the drift layer 1, the peeling further extending outside the outer peripheral opening part 71 can be prevented.

Generally, the electrical field tends to be particularly concentrated near the pn junction in the semiconductor, and in the SBD 100 of the present embodiment 1, the electrical field tends to be concentrated near the pn junction formed by the drift layer 1 and the terminal well region 2. Accordingly, the electrical field tends to be concentrated near an outer end edge portion (a right end in FIG. 1) of the terminal well region 2 on the front surface S2. If the peeling of the surface protection film 6 extends to this high electrical field region, an aerial discharge occurs easily. When the outer peripheral opening part 71 is provided to be located on the terminal well region 2 and the outer peripheral opening part 71 is located inside (the left side in FIG. 3) the outer end surface (the right end in FIG. 3) of the terminal well region 2, the extension of peeling of the surface protection film 6 to the high electrical field region described above is prevented. Thus, the aerial discharge caused by the peeling of the surface protection film 6 can be avoided.

A potential gradient generally occurs in a depleted region in a surface of a semiconductor, and a potential gradient occurs in a region where the maximum depletion layer MDL is exposed to the surface of the epitaxial substrate 30 in the SBD 100 of the present embodiment 1. Thus, the electrical field tends to be concentrated in the region where the maximum depletion layer MDL is exposed to the surface of the epitaxial substrate 30 on the front surface S2. If the peeling of the surface protection film 6 extends to this high electrical field region, an aerial discharge occurs easily. When the outer peripheral opening part 71 is provided to be located on the terminal well region 2 and the outer peripheral opening part 71 is located inside (the left side in FIG. 3) the region ER where the maximum depletion layer MDL is exposed to the surface of the epitaxial substrate 30, the extension of peeling of the surface protection film 6 to the high electrical field region described above is prevented. Thus, the aerial discharge caused by the peeling of the surface protection film 6 can be avoided.

The similar effect is also obtained in the modification examples 1 to 5 of the embodiment 1. That is to say, with reference to FIG. 4, when the high resistance film 15 is provided in place of the surface protection film 6 as with the SBD 101, a potential gradient occurs by current flowing in the high resistance film 15 further inside the region ER where the maximum depletion layer MDL is exposed to the surface of the epitaxial substrate 30 as illustrated in FIG. 3, and the high electrical field tends to occur in an outer end edge portion of the surface electrode 5. At this time, the insulating material tends to be deposited on the upper surface and the lateral surface of the electrode pad 5b in the end edge portion of the electrode pad 5b. In the SBD 101 illustrated in FIG. 4, the outer peripheral opening part 72 of the high resistance film 15 is provided outside the end edge portion of the electrode pad 5b. Accordingly, even if the peeling of the high resistance film 15 occurs from the end edge portion of the electrode pad 5b to the end edge portion of the drift layer 1, the peeling further extending outside the outer peripheral opening part 71 can be prevented.

When the surface protection film 6 is provided on the high resistance film 15 as with the SBD 102 described using FIG. 5, there is a possibility that the insulating material deposited on the upper surface and the lateral surface of the electrode pad 5b causes the occurrence of peeling of both the high resistance film 15 and the surface protection film 6. Thus, when at least one of the outer peripheral opening part 72 passing through the high resistance film 15 and the outer peripheral opening part 71 (FIG. 1) passing through the surface protection film 6 is provided, the extension of peeling of the high resistance film 15 and the surface protection film 6 can be suppressed.

With reference to FIG. 6, when the outer peripheral opening part 71A made up of the plurality of partial opening parts 711 and 712 separated from each other is provided as with the SBD 103, the extension of peeling of the surface protection film 6 can be suppressed, and the peeling of the surface protection film 6 in one of the inner end edge portion and the outer end edge portion caused by the stress occurring in a thermal processing in a process of manufacturing the semiconductor device, for example, can be suppressed. That is to say, the outer peripheral opening part 71A is not the continuous opening part but is made up of the plurality of partial opening parts 711 and 712, thus intensity of the surface protection film 6 is secured by the continuous region, and the peeling caused by the stress can be suppressed.

An electrical field concentration generally tends to occur near the corner portion of the surface electrode 5 having the curvature in a plan view, and the insulating material is deposited more easily on the upper surface and the lateral surface of the electrode pad 5b. Thus, the continuous region is not provided but the partial opening part 712 is provided in the portion along the corner portion of the surface electrode 5 in a plan view, thus the extension of peeling of the surface protection film 6 caused by the deposited insulating material is suppressed.

With reference to FIG. 7, the outer peripheral opening part 71 reaching the field insulating film 3 is provided away from the surface electrode 5 in the surface protection film 6 in the SBD 104, thus in the case where the insulating material is deposited on the upper surface and the lateral surface of the electrode pad 5b, even if the peeling of the surface protection film 6 from the field insulating film 3 occurs from the outer end edge portion of the electrode pad 5b to the outside of the drift layer 1, the extension of peeling further outside the outer peripheral opening part 71 can be prevented.

The field insulating film 3 is provided on the front surface S2 of the epitaxial layer 32 as with the SBD 104, thus a region where the surface protection film 6 has direct contact with the surface of the semiconductor is reduced, thus it can be suppressed that floating ions caused by an influence of moisture, for example, reach the epitaxial layer 32 and serve as a fixed charge on the surface of the semiconductor.

That is to say, when the depletion layer expends in the semiconductor layer, a minus space charge is formed in the p layer and a plus space charge is formed in the n layer in the depletion layer, and are connected by an electrical line of force. When there is a fixed charge, the electrical line of force also connects the space charge and the fixed charge, thus the space charge effectively increases and decreases in the depletion layer. When the floating ions serve as the fixed charge, the space charge in the depletion layer effectively increases and decreases as described above, and is not preferable. However, when the field insulating film 3 is provided, it can be suppressed that the floating ions reach the epitaxial layer 32 and serve as the fixed charge.

Even in the case where the field insulating film 3 is provided on the front surface S2 of the epitaxial layer 32 as with the SBD 104, there is a possibility that the epitaxial layer 32 and moisture react with each other outside the outer end edge portion of the field insulating film 3, and $SiO_2$ is deposited and the surface protection film 6 is peeled.

Thus, when the outer peripheral opening part 73 passing through the surface protection film 6 is provided near the outer end edge portion of the field insulating film 3 as with the SBD 105 described using FIG. 8, the extension of peeling of the surface protection film 6, which occurs from the outer end edge portion of the field insulating film 3, further inside the outer peripheral opening part 73 can be prevented even in a case where $SiO_2$ is deposited near the outer end edge portion of the field insulating film 3.

When the outer peripheral opening part 73 is located outside (the right side in FIG. 3) the region ER where the maximum depletion layer MDL is exposed to the surface of the epitaxial substrate 30 as illustrated in FIG. 8, the extension of peeling of the surface protection film 6 to the region ER described above is prevented. Thus, increase in a leakage current and the aerial discharge caused by the peeling of the surface protection film 6 can be avoided.

Manufacturing Method

Next, a method of manufacturing the SBD 100 of the embodiment 1 is described using FIG. 9 to FIG. 14 which are cross-sectional views each illustrating a manufacturing process in series.

Figure 9:
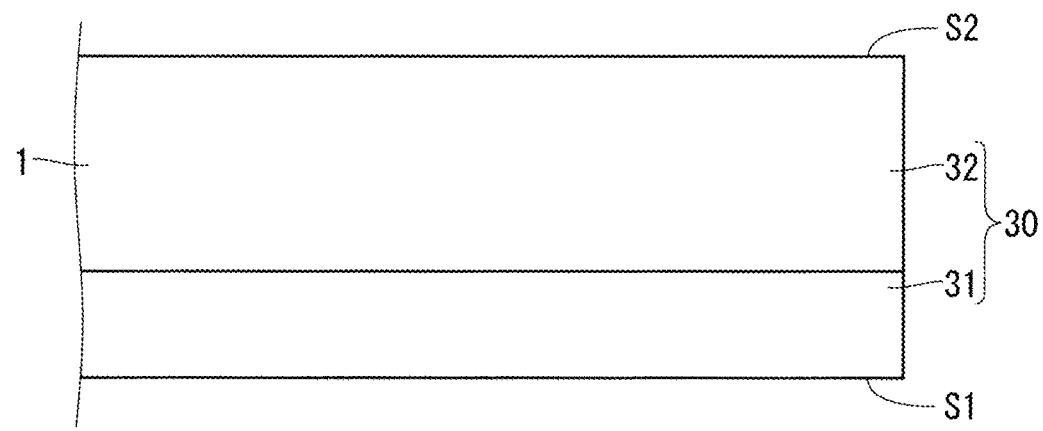
FIG. 9 A partial cross-sectional view illustrating a process of manufacturing the semiconductor device of the embodiment 1 according to the present invention.

Firstly, in a process illustrated in FIG. 9, a low-resistance single crystal substrate 31 including an n-type impurity at a relatively high concentration ($n^+$) is prepared. The single crystal substrate 31 is an SiC substrate having a polytype of 4H, and has an off angle of four degrees or eight degrees.

Next, SiC is epitaxially grown on the single crystal substrate 31, and the n-type epitaxial layer 32 having an impurity concentration equal to or larger than $1\times10^{14}/cm^3$ and equal to or smaller than $1\times10^{17}/cm^3$ is formed to obtain the epitaxial substrate 30.

Figure 10:
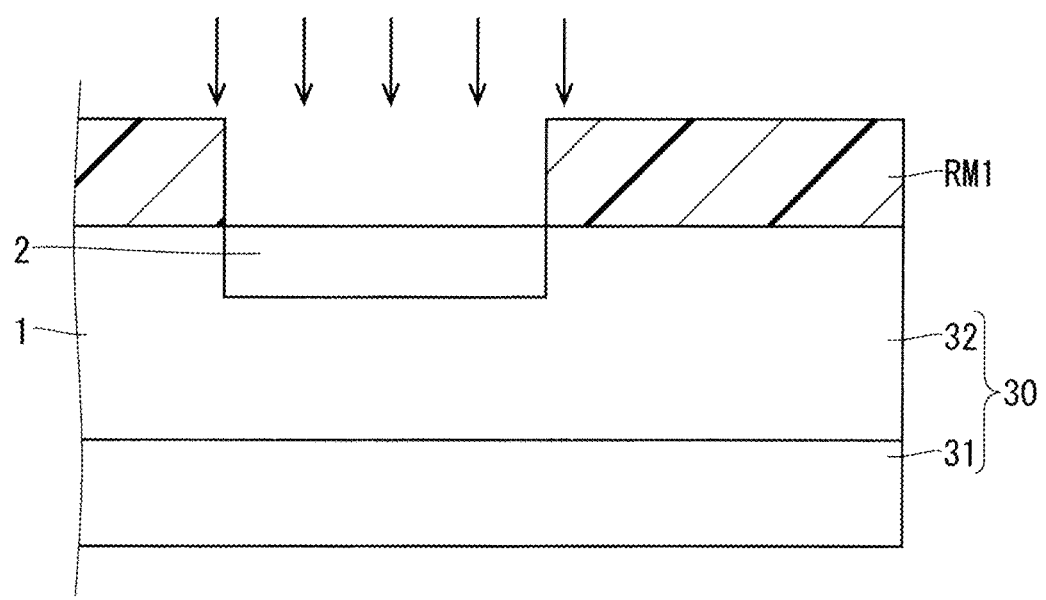
FIG. 10 A partial cross-sectional view illustrating the process of manufacturing the semiconductor device of the embodiment 1 according to the present invention.

Next, in a process illustrated in FIG. 10, a resist mask RM1 having a predetermined pattern is formed on the epitaxial layer 32 by a photolithography process, and subsequently, a p-type impurity (acceptor) such as Al or boron (B) is ion-implanted using the resist mask RM1 as an implantation mask to form the p-type terminal well region 2 on an upper layer portion of the epitaxial layer 32. A dose amount of the terminal well region 2 is preferably equal to or larger than $0.5\times10^{13}/cm^2$ and equal to or smaller than $5\times10^{13}/cm^2$, and is $1.0\times10^{13}/cm^2$, for example.

In the case where Al is ion-implanted, implantation energy of ion implantation is equal to or larger than 100 keV and equal to or smaller than 700 keV, for example. In this case, the impurity concentration converted from the dose amount [$cm^{-2}$] described above is equal to or larger than $1\times10^{17}/cm^3$ and equal to or smaller than $1\times10^{19}/cm^3$.

In forming the terminal well region 2, the resist mask RM1 is patterned so that at least one p-type impurity region having looped shape is formed outside the terminal well region 2, thus the impurity region can be formed at the same time.

The processes of patterning of the resist mask and ion implantation are performed repeatedly, the terminal well region 2 having a plurality of impurity concentrations can be formed.

After forming the terminal well region 2, a thermal processing device performs annealing at a temperature equal to or larger than 1300° C. and equal to or smaller than 1900° C. for thirty seconds to one hour in an inactive gas atmosphere such as argon (Ar) gas. The impurity added by the ion implantation is activated by the annealing.

Figure 11:
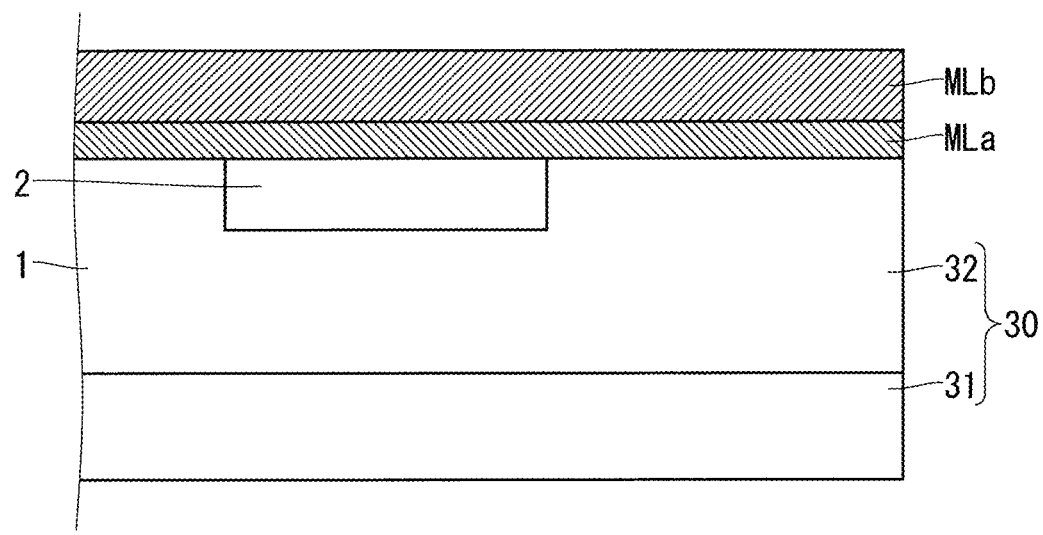
FIG. 11 A partial cross-sectional view illustrating the process of manufacturing the semiconductor device of the embodiment 1 according to the present invention.

Next, in a process illustrated in FIG. 11, a material layer MLa of the Schottky electrode 5a and a material layer MLb of the electrode pad 5b are formed in this order on the epitaxial layer 32 by sputtering method, for example. The material layer MLa is formed by a Ti film having a thickness of 100 nm, for example, and the material layer MLb is formed by an Al film having a thickness of 3 μm, for example.

Figure 12:
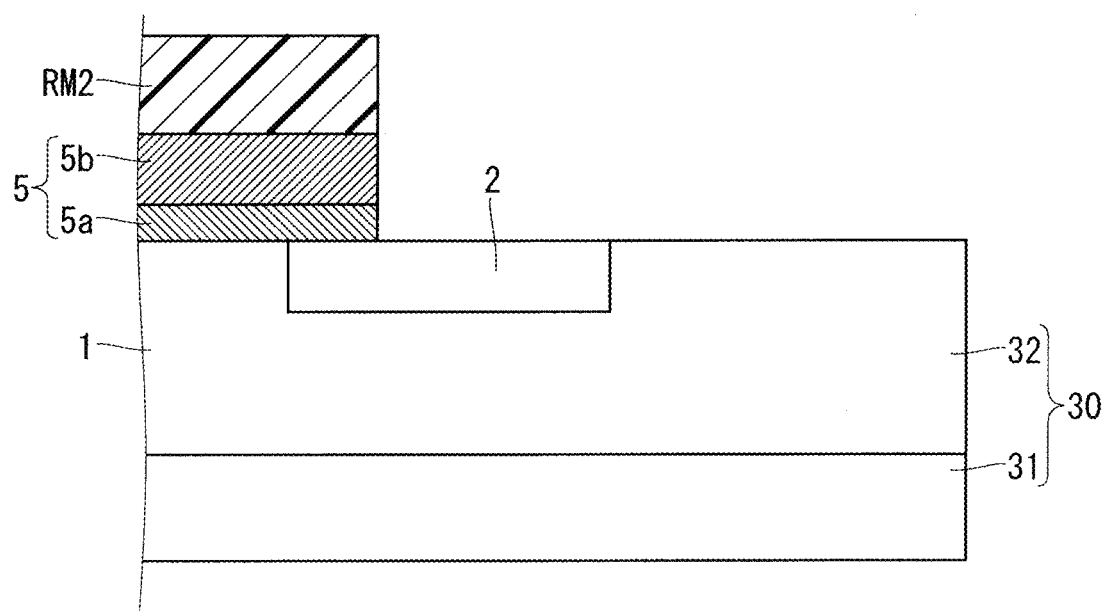
FIG. 12 A partial cross-sectional view illustrating the process of manufacturing the semiconductor device of the embodiment 1 according to the present invention.

Next, in a process illustrated in FIG. 12, a resist mask RM2 having a predetermined pattern is formed on the material layer MLb by a photolithography process, and subsequently, the material layer MLb and the material layer MLa are patterned using the resist mask RM2 as an etching mask, and the Schottky electrode 5a and the electrode pad 5b each having a predetermined shape are formed to obtain the surface electrode 5.

Dry etching or wet etching can be used for etching of the material layer MLb and the material layer MLa. An hydrofluoric acid (HF) or phosphoric acid system etching solution is used as an etching solution of the wet etching.

The patterning of the Schottky electrode 5a and the patterning of the electrode pad 5b may be performed separately. Achievable in this case is a structure that the end edge portion of the electrode pad 5b protrudes from the end edge portion of the Schottky electrode 5a and the electrode pad 5b completely covers the Schottky electrode 5a. Achievable alternatively is a structure that the end edge portion of the Schottky electrode 5a protrudes from the end edge portion of the electrode pad 5b, and part of the Schottky electrode 5a is not covered by the electrode pad 5b.

Figure 13:
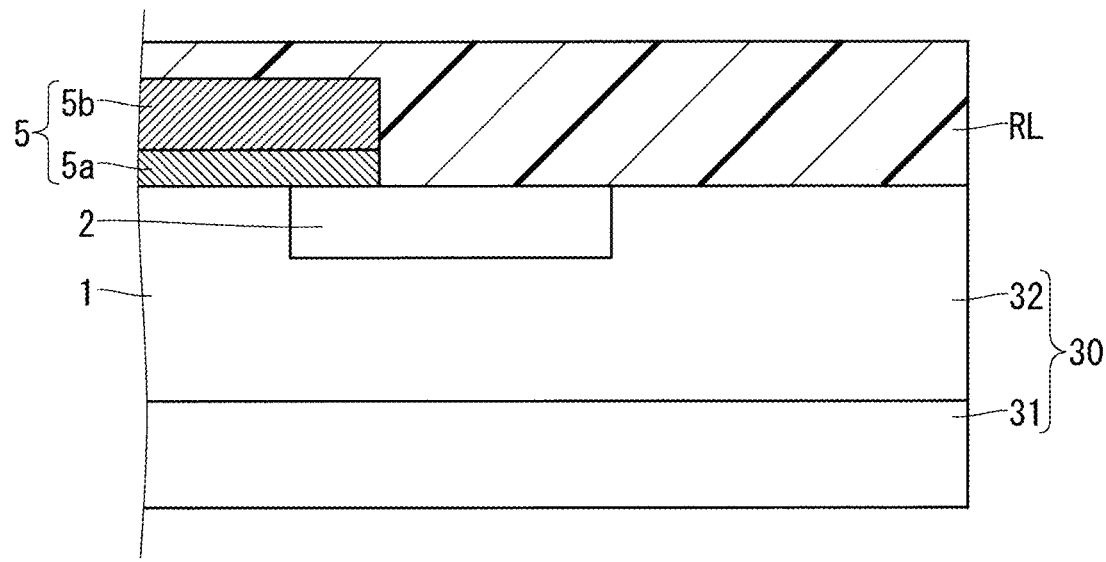
FIG. 13 A partial cross-sectional view illustrating the process of manufacturing the semiconductor device of the embodiment 1 according to the present invention.

Next, in a process illustrated in FIG. 13, a resin layer RL is formed to cover the surface electrode 5 and the front surface S2 of the epitaxial substrate 30. The resin layer RL is formed by applying photoactive polyimide, for example.

Figure 14:
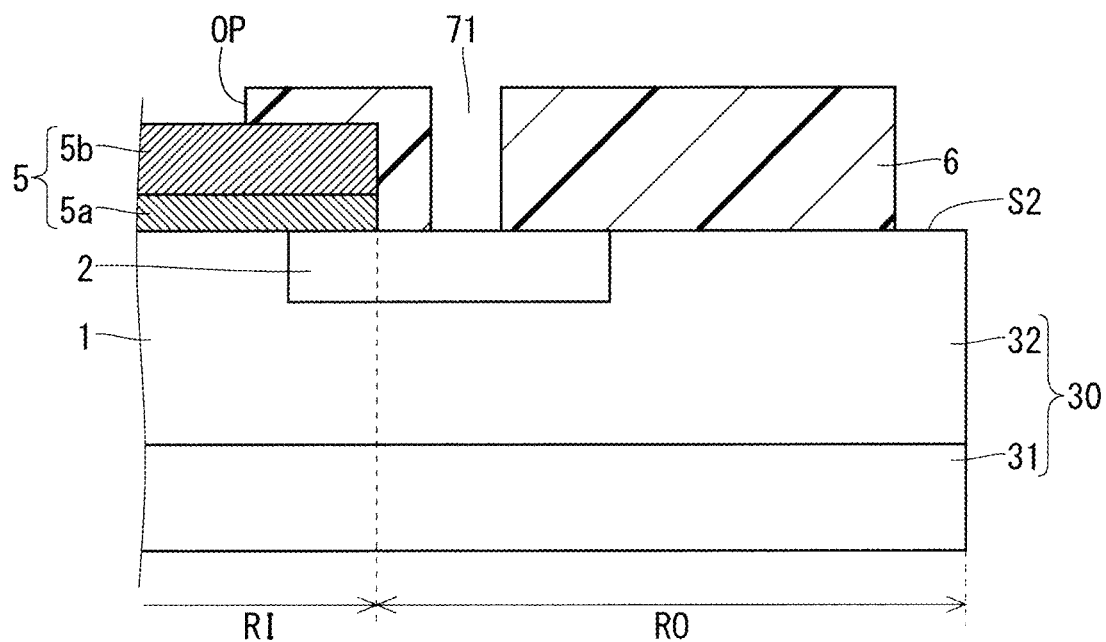
FIG. 14 A partial cross-sectional view illustrating the process of manufacturing the semiconductor device of the embodiment 1 according to the present invention.

Next, in a process illustrated in FIG. 14, the resin layer RL is patterned by a photolithography process to form the surface protection film 6 covering the end edge portion of the surface electrode 5 and at least part of the outer side region RO in the epitaxial substrate 30. At this time, the resin layer RL is patterned so that the outer peripheral opening part 71 is formed in a predetermined position on the terminal well region 2 away from the surface electrode 5.

Next, the back surface electrode 8 is formed on the back surface S1 of the epitaxial substrate 30 by sputtering method, for example, to obtain the SBD 100 illustrated in FIG. 1.

The back surface electrode 8 may be formed before or after the process of forming the material layers MLa and MLb described using FIG. 11. Metal including one or some of Ti, Ni, Al, Cu, and Au, for example, can be used as a material of the back surface electrode 8. A thickness of the back surface electrode 8 is preferably equal to or larger than 50 nm and equal to or smaller than 2 μm, and is made up of two-layered film of Ti and Al (Ti/Au) having a thickness of 1 μm, for example.

In the patterning of the surface protection film 6, an exposure mask for forming the outer peripheral opening part 71A made up of the plurality of partial opening parts 711 and the plurality of partial opening parts 712 illustrated in FIG. 6 in place of the outer peripheral opening part 71 is used, thus the SBD 103 illustrated in FIG. 6 can be obtained.

Figure 15:
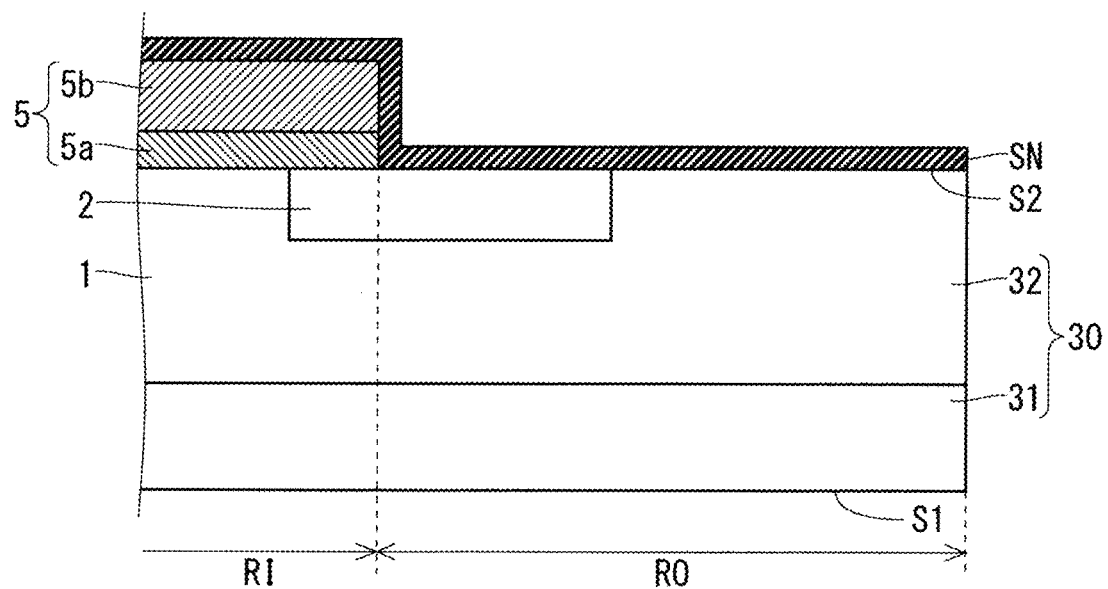
FIG. 15 A partial cross-sectional view illustrating the process of manufacturing the semiconductor device of the embodiment 1 according to the present invention.

Herein, when the SBD 101 described using FIG. 4 is manufactured, an SiN film SN is formed on the front surface S2 of the epitaxial substrate 30 where the surface electrode 5 is provided by plasma chemical vapor deposition (CVD)

method, for example, as illustrated in FIG. 15 in place of the process described using FIG. 13. In this process, a ratio of Si and N is adjusted, thus a resistivity of the SiN film SN can be adjusted. Next, the SiN film SN is patterned by a photolithography process and an etching process to form the high resistance film 15 illustrated in FIG. 4. At this time, the SiN film SN is patterned so that the outer peripheral opening part 72 is formed in a predetermined position on the terminal well region 2 away from the surface electrode 5. A thickness of the high resistance film 15 is preferably equal to or larger than 100 nm, and is 1 μm, for example.

Figure 16:
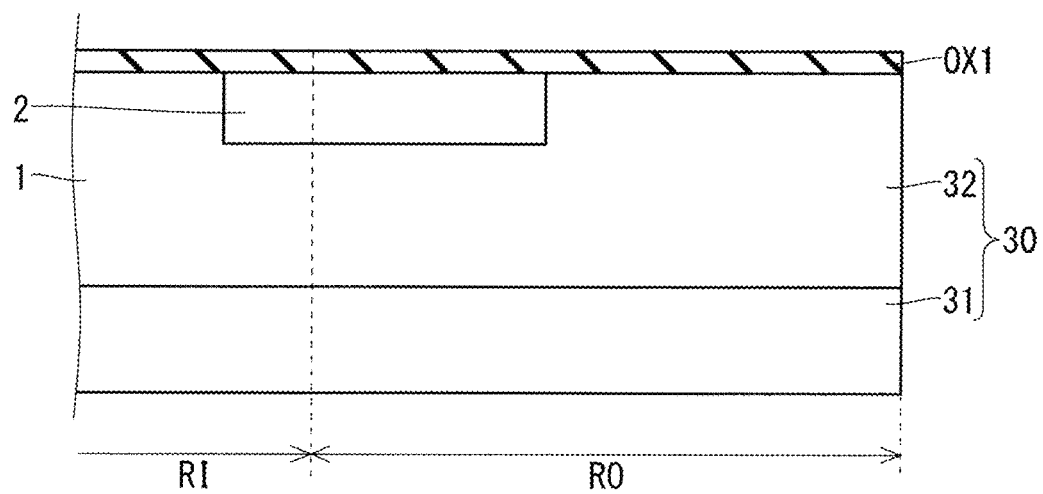
FIG. 16 A partial cross-sectional view illustrating the process of manufacturing the semiconductor device of the embodiment 1 according to the present invention.

When the SBD 104 described using FIG. 7 and the SBD 105 described using FIG. 8 are manufactured, an $SiO_2$ film OX1 having a thickness of 1 μm is formed on the front surface S2 of the epitaxial substrate 30 by CVD method, for example, as illustrated in FIG. 16 before the process described using FIG. 11. Next, the $SiO_2$ film OX1 is patterned by a photolithography process and an etching process to form the field insulating film 3 illustrated in FIG. 7 and FIG. 8. At this time, the patterning is performed so that the field insulating film 3 extends to the inner side region RI from the boundary between the inner side region RI and the outer side region RO on the epitaxial layer 32, extends to the outer side region RO, and further extends beyond an end portion of the terminal well region 2 in the outer side region RO.

Outline

According to the configurations of the embodiment 1 and the modification example thereof described above, the extension of peeling of the surface protection film 6 beyond the outer peripheral opening parts 71, 72, and 73 is prevented, thus insulation protection of the outer side region RO is maintained by the surface protection film 6 outside the outer peripheral opening parts 71 and 72 and inside the outer peripheral opening part 73, and insulation reliability of the SBD can be increased.

Embodiment 2

A semiconductor device of an embodiment 2 according to the present invention is described hereinafter with reference to FIG. 17 to FIG. 33.

Configuration of Device

Figure 17:
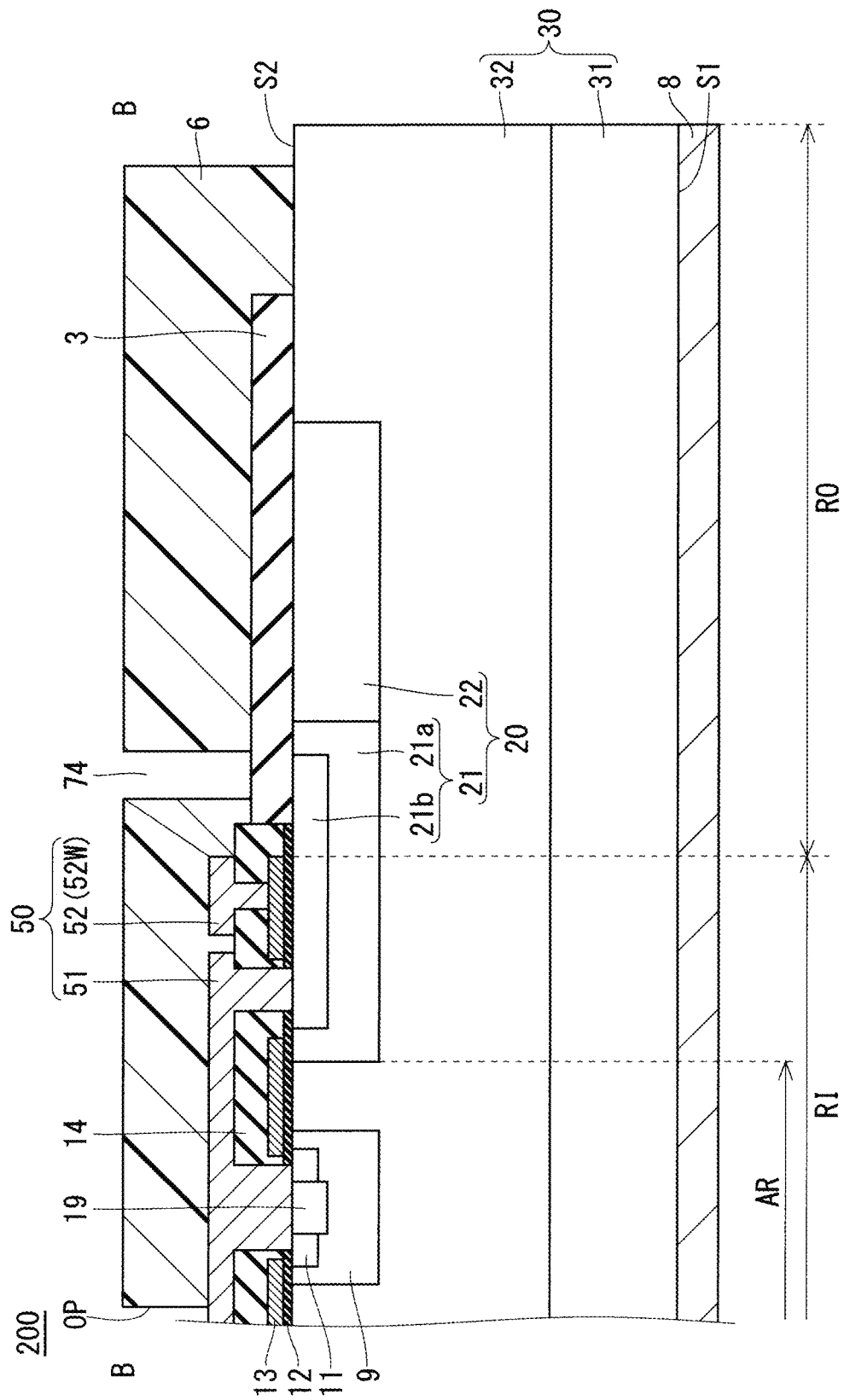
FIG. 17 A partial cross-sectional view illustrating a configuration of a semiconductor device of an embodiment 2 according to the present invention.
Figure 18:
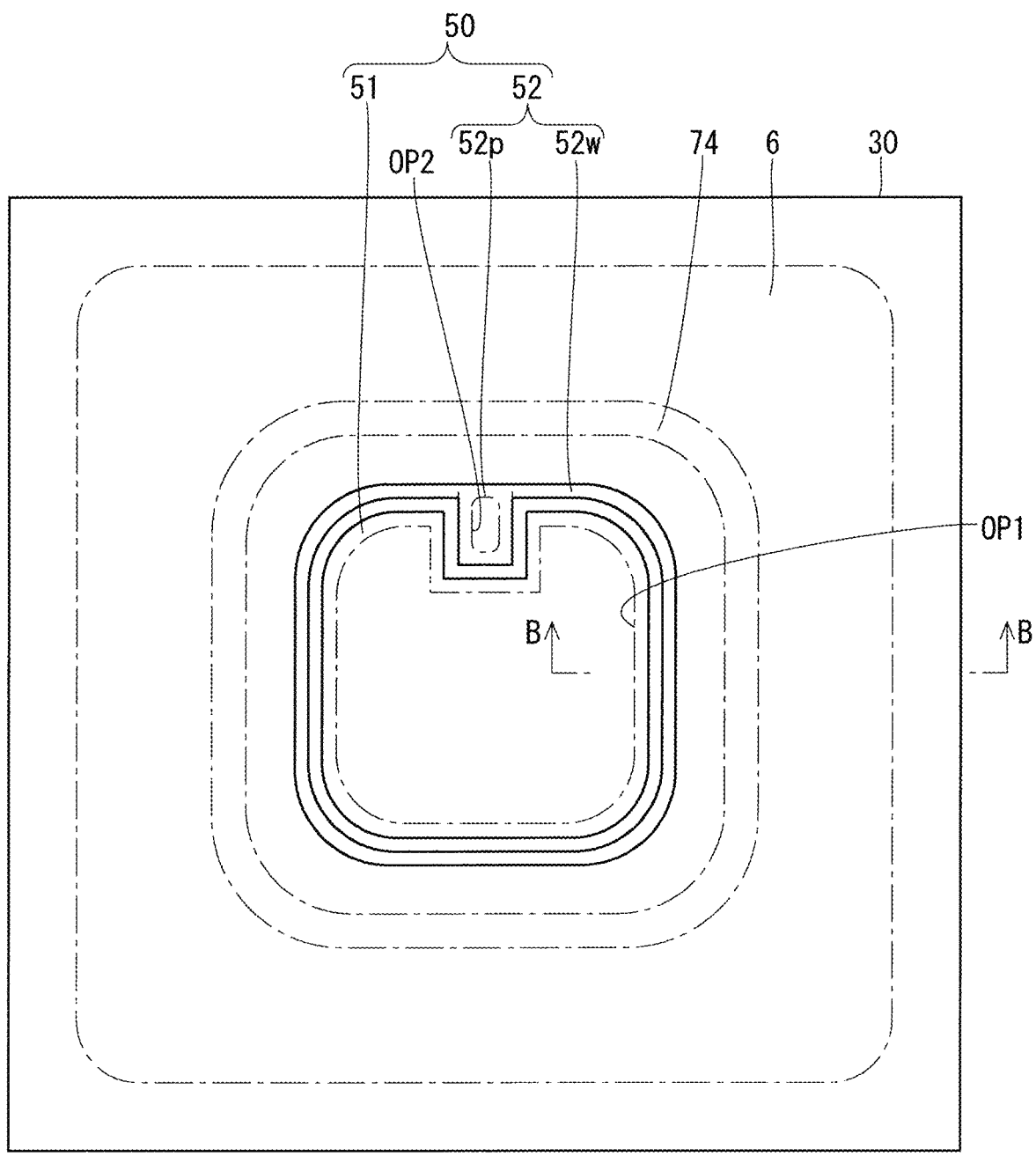
FIG. 18 A plan view illustrating the configuration of the semiconductor device of the embodiment 2 according to the present invention.

FIG. 17 is a partial cross-sectional view illustrating a configuration of a MOSFET 200 (semiconductor device) of the embodiment 2 according to the present invention, and FIG. 18 is a plan view illustrating the configuration of the MOSFET 200. A cross-sectional view along a B-B line in an arrow direction in FIG. 18 corresponds to FIG. 17. In FIG. 18, the surface protection film 6 in the upper surface configuration of the MOSFET 200 is omitted for convenience, and the surface protection film 6 and an outer peripheral opening part 74 of the surface protection film 6 are indicated by a broken line. In FIG. 17, a right side is a terminal region of the MOSFET 200 and a left side is an active region AR in which a main current flows in an ON state of the MOSFET 200.

Figure 19:
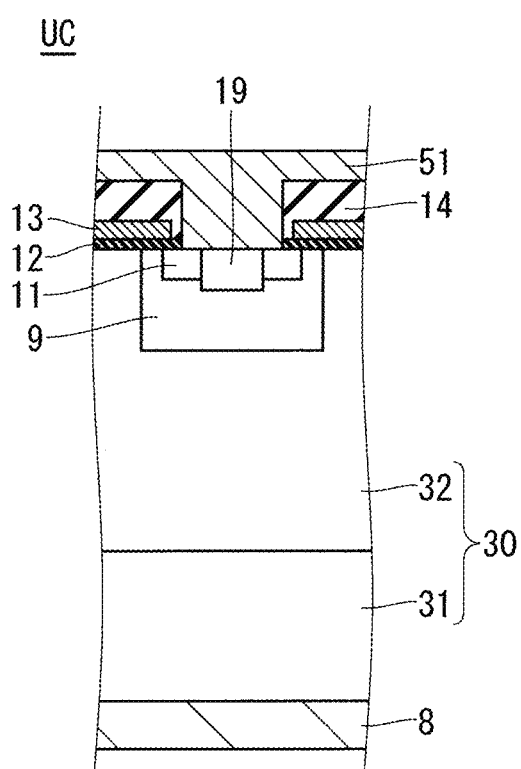
FIG. 19 A cross-sectional view illustrating a configuration of a unit cell of the semiconductor device of the embodiment 2 according to the present invention.

FIG. 19 is a cross-sectional view illustrating a configuration of a unit cell UC which is a minimum unit structure of the MOSFET in the active region AR. The active region AR is made up of an arrangement of the plurality of unit cells UC.

In FIGS. 17 to 19, the same reference numerals are assigned to the same constituent elements as those of the SBD 100 described using FIG. 1 and FIG. 2, and the repetitive description is omitted.

The MOSFET 200 includes the epitaxial substrate 30, the back surface electrode 8 (the first main electrode), a surface electrode 50 (an electrode structure), the surface protection film 6, and the field insulating film 3. The MOSFET 200 includes a gate insulating film 12, a gate electrode 13, and an interlayer insulating film 14.

In the present embodiment, the epitaxial substrate 30 is an SiC substrate having a polytype of 4H, and the MOSFET 200 is an SiC-MOSFET.

The surface electrode 50, the field insulating film 3, and the surface protection film 6 are provided on the front surface S2 of the epitaxial substrate 30, and an inner side in relation to an end surface of the surface electrode 50 is defined as the inner side region RI and an outer side is defined as the outer side region RO. The back surface electrode 8 is provided on the back surface S1.

The epitaxial substrate 30 includes the n-type (first conductivity type) single crystal substrate 31 (support substrate) made of SiC and the epitaxial layer 32 (semiconductor layer) formed on the single crystal substrate 31. The epitaxial layer 32 is an SiC layer.

The epitaxial layer 32 includes a terminal well region 20 and an element well region 9 selectively provided on the upper layer portion of the epitaxial layer 32 and a contact region and 19 and a source region 11 selectively provided on an upper layer portion of the element well region 9. Major portion of the epitaxial layer 32 is the drift layer 1 in which current flows by drift except for these impurity regions.

The drift layer 1 has the same n-type conductivity type as that of the single crystal substrate 31 in the present embodiment. An impurity concentration of the drift layer 1 is lower than that of the single crystal substrate 31. Thus, the single crystal substrate 31 has a lower resistivity than the drift layer 1. The impurity concentration of the drift layer 1 is equal to or larger than $1\times10^{14}/cm^3$ and equal to or smaller than $1\times10^{17}/cm^3$.

The source region 11 has the same n-type conductivity type as that of the drift layer 1, and the terminal well region 20, the element well region 9, and the contact region 19 have the p-type conductivity, however, the impurity concentration of the contact region 19 is set higher than that of the element well region 9.

The terminal well region 20 has a portion extending to the inner side region RI and the outer side region RO from a boundary between the inner side region RI and the outer side region RO in the upper layer portion of the epitaxial layer 32. In other words, the terminal well region 20 is provided across the boundary between the inner side region RI and the outer side region RO.

The terminal well region 20 includes a boundary region 21 which is a region across the boundary between the inner side region RI and the outer side region RO and an extension region 22 extending further outside the boundary region 21.

The boundary region 21 is provided to surround the active region AR, and includes a low concentration region 21a (first region) having a low impurity concentration and a high concentration region 21b (second region) provided on an upper layer portion of the low concentration region 21a and having a higher impurity concentration than the low concentration region 21a.

The surface electrode 50 is provided to have contact with at least part of the front surface S2 of the inner side region RI in the epitaxial substrate 30, and the inner side in relation to the end surface of the surface electrode 50 is defined as the inner side region RI and the outer side is defined as the outer side region RO. In the present embodiment, the surface electrode 50 is provided over the whole inner side region RI, and is not provided in the outer side region RO. The surface electrode 50 includes a source electrode 51 (second main electrode) and a gate wiring electrode 52 (control wiring electrode).

The source electrode 51 is connected to the high concentration region 21b in the terminal well region 20 to form ohmic contact, and connected to the source region 11 in the element well region 9. The source electrode 51 is connected to the contact region 19 to form ohmic contact, and is provided over the whole active region AR.

The gate wiring electrode 52 is an electrode for receiving a gate signal (control signal) for controlling an electrical path between the source electrode 51 and the back surface electrode 8 functioning as a drain electrode, connected to the gate electrode 13 provided on the high concentration region 21b via the gate insulating film 12, and provided separately and electrically insulated from the source electrode 51. The inner side in relation to the end surface on the outer side of the gate wiring electrode 52 is defined as the inner side region RI, and the outer side is defined as the outer side region RO.

As illustrated in FIG. 18, the gate wiring electrode 52 is made up of a gate wiring 52w provided to surround the source electrode 51 and a gate pad 52p provided to be embedded in a concave portion on one side of the rectangular source electrode 51 in a plan view and to which the gate wiring 52w is connected. The gate wiring electrode 52 illustrated in FIG. 17 corresponds to the gate wiring 52w.

The field insulating film 3 is provided on the front surface S2 of the outer side region RO in the epitaxial substrate 30, and covers part of the boundary region 21 in the terminal well region 20 and the whole extension region 22 to extend near the end edge portion of the epitaxial substrate 30. However, the field insulating film 3 is not provided in the inner side region RI but forms an opening part.

In FIG. 17, an inner peripheral end of the field insulating film 3 has contact with an end surface of the interlayer insulating film 14, however, the interlayer insulating film 14 may be formed to be located on the end edge portion of the field insulating film 3.

The interlayer insulating film 14 is provided to cover the gate insulating film 12 and the gate electrode 13, and electrically insulates the source electrode 51 and the gate electrode 13. The interlayer insulating film 14 is provided across the inner side region RI and the outer side region RO in the epitaxial substrate 30, and the surface electrode 50 is provided thereon. In other words, the surface electrode 50 is provided so that the whole surface electrode 50 is located on the interlayer insulating film 14.

The gate electrode 13 is provided on the high concentration region 21b in the terminal well region 20 via the gate insulating film 21, and is also provided on an upper side between the source regions 11 in the unit cells UC (FIG. 19) adjacent to each other in the active region AR via the gate insulating film 12. The gate electrode 13 provided in the active region AR is connected to the gate electrode 13 provided on the terminal well region 20, and the gate signal is supplied from the gate pad 52p via the gate wiring 52w.

The surface protection film 6 covers the source electrode 51 and the gate wiring electrode 52 on the end edge portion of the surface electrode 50 and at least part of the outer side region RO in the epitaxial substrate 30. The surface protection film 6 includes opening parts OP1 and OP2 on a central portion of the source electrode 51 and a central portion of the gate pad 52p, respectively, as illustrated in FIG. 18 so that the source electrode 51 and the gate pad 52p of the gate wiring electrode 52 can function as external terminals.

The surface protection film 6 has the outer peripheral opening part 74 reaching the field insulating film 3 in a position away from the gate wiring electrode 52 in the outer side region RO inside an outer end surface of the high concentration region 32b. The outer peripheral opening part 74 is preferably provided to be located on the terminal well region 20, and is continuously provided in a looped form to surround the surface electrode 50 as illustrated in FIG. 18. It is preferable that the surface protection film 6 is made up of an insulating material and is resin such as polyimide, for example, to reduce stress from outside.

As with the SBD 100 in the embodiment 1, based on an assumption of a maximum depletion layer extending from the boundary between the drift layer 1 and the terminal well region 2 in a case where maximum voltage is also applied in the MOSFET 200, the outer peripheral opening part 74 is preferably provided on an inner side, that is to say, the left side in FIG. 17 away from the region where the maximum depletion layer reaches (is exposed to) the front surface S2 of the epitaxial substrate 30.

In the above description, the epitaxial substrate 30 is made up of SiC. SiC has a wider band gap than Si, and the SiC semiconductor device using SiC is excellent in pressure resistance, and has a high allowable current density and heat resistance compared with the Si semiconductor device using Si, thus can be operated under high temperature.

The material is not limited to SiC, however, the epitaxial substrate 30 may also be made up of the other wide band gap semiconductor such as gallium nitride (GaN), for example. Si, for example, may also be used in place of the wide band gap semiconductor. The semiconductor device may be a transistor other than a MOSFET, thus may be a junction FET (JFET) or an insulated gate bipolar transistor (IGBT), for example. A planar type transistor is exemplified in the present embodiment, however, a trench type transistor is also applicable.

Modification Example 1

Figure 20:
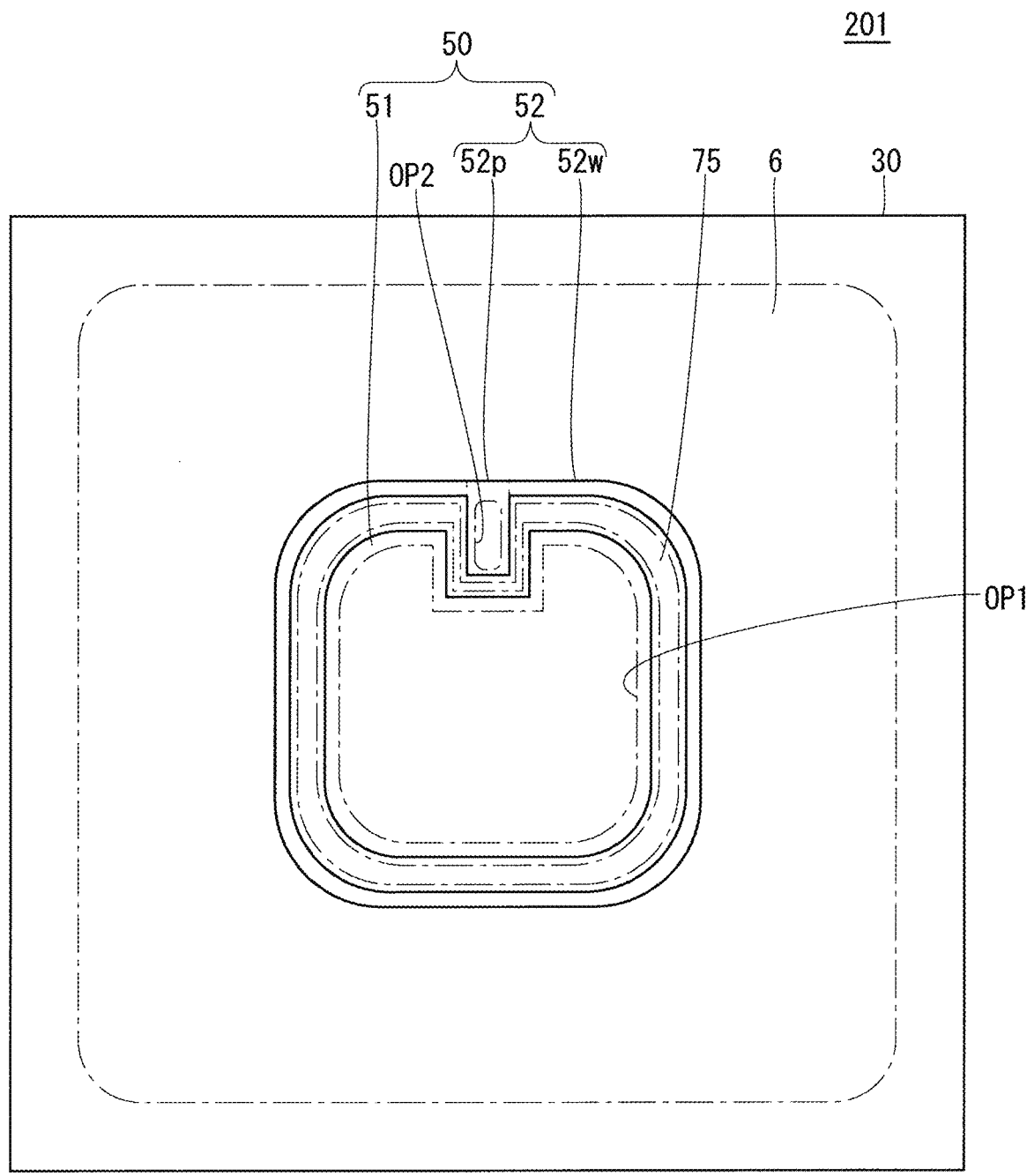
FIG. 20 A plan view illustrating a configuration of a modification example 1 of the semiconductor device of the embodiment 2 according to the present invention.

FIG. 20 is a plan view illustrating a configuration of a MOSFET 201 in a modification example 1 of the embodiment 2, and is a drawing corresponding to FIG. 18. As illustrated in FIG. 20, provided in the MOSFET 201 is an outer peripheral opening part 75 in a region between the source electrode 51 and the gate wiring electrode 52 in place of the outer peripheral opening part 74 in the MOSFET 200.

Modification Example 2

Figure 21:
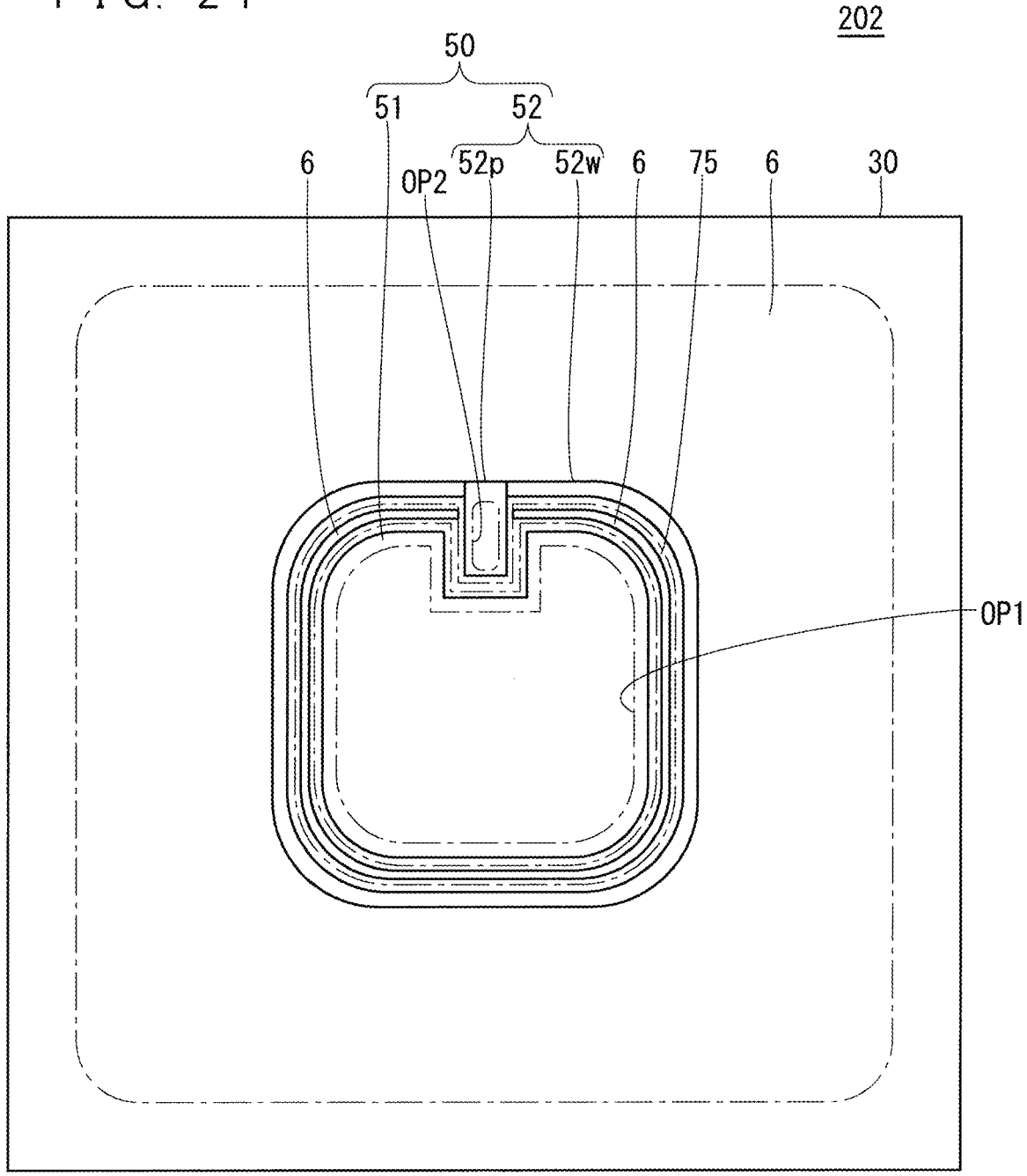
FIG. 21 A plan view illustrating a configuration of a modification example 2 of the semiconductor device of the embodiment 2 according to the present invention.

FIG. 21 is a plan view illustrating a configuration of a MOSFET 202 in a modification example 2 of the embodiment 2, and is a drawing corresponding to FIG. 18. As illustrated in FIG. 21, provided in the MOSFET 202 is the surface protection film 6 dividing a side of the source electrode 51 (inner periphery side) and a side of the gate wiring electrode 52 (outer periphery side) in the outer peripheral opening part 75 inside the outer peripheral opening part 75 of the MOSFET 201 described using FIG. 20.

Modification Example 3

Figure 22:
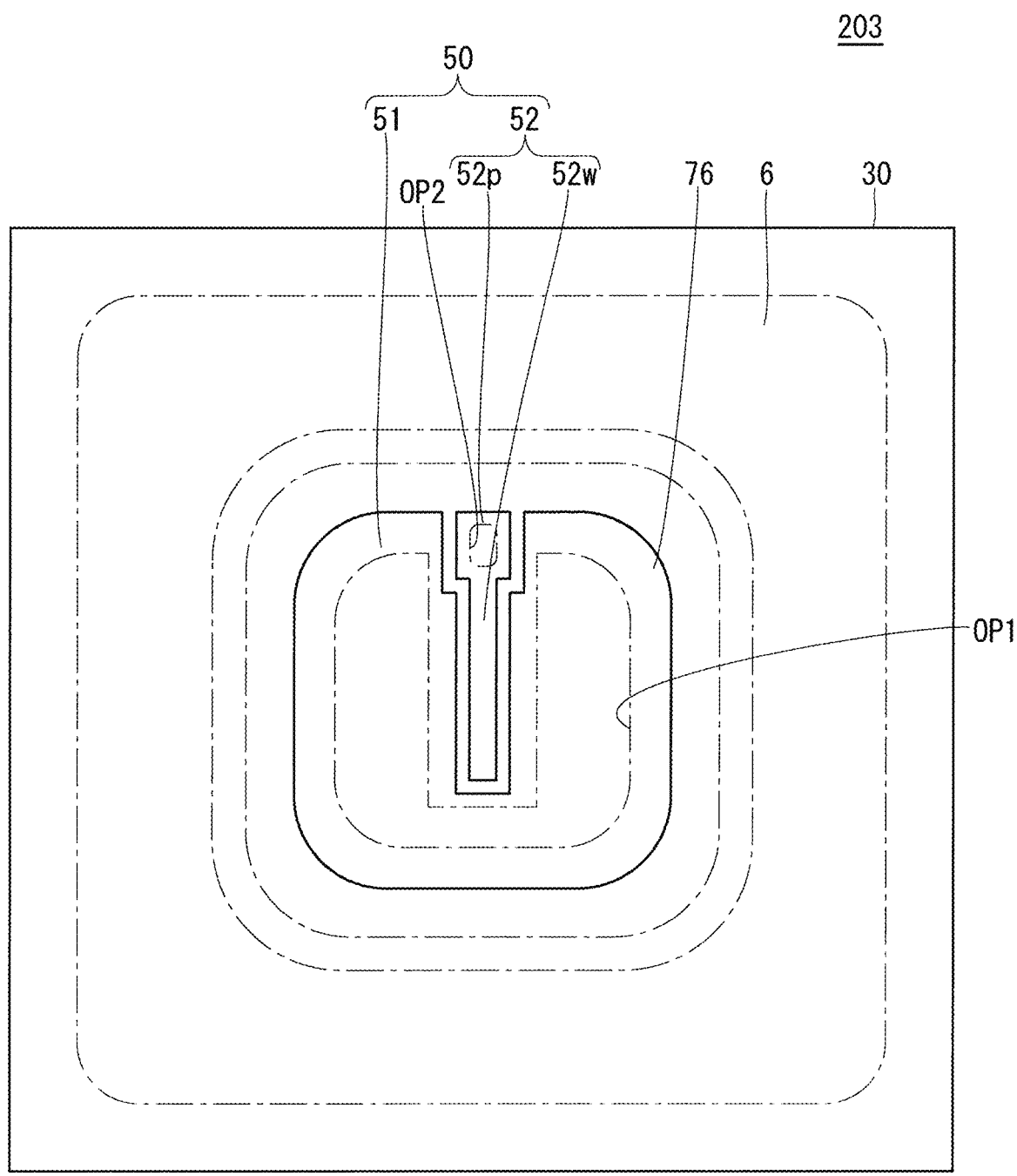
FIG. 22 A plan view illustrating a configuration of a modification example 3 of the semiconductor device of the embodiment 2 according to the present invention.

FIG. 22 is a plan view illustrating a configuration of a MOSFET 203 in a modification example 3 of the embodiment 2, and is a drawing corresponding to FIG. 18. As illustrated in FIG. 22, provided in the MOSFET 203 is a concave portion provided in one side of the rectangular source electrode 51 in a plan view to extend to a position more than half of the source electrode 51 in length, and the gate wiring electrode 52 is provided to be embedded therein. That is to say, the MOSFET 200 has a configuration that only the gate pad 52*p* is embedded in the concave portion provided in one side of the source electrode 51, and the gate wiring 52*w* is provided to surround the source electrode 51, however, in the MOSFET 203, the elongated gate wiring 52*w* is embedded in the concave portion, and the gate pad 52*p* is provided on a side of the opening end of the concave portion.

The p-type well region is provided in the active region AR located below the gate wiring 52*w* and the gate pad 52*p*, and the gate wiring electrode 52 is provided on the well region via the gate insulating film. Each gate electrode 13 of each unit cell UC (FIG. 19) is connected to the gate wiring 52*w* via the opening part provided in the interlayer insulating film 14.

An outer peripheral opening part 76 is provided to surround the source electrode 51 in a position away from the source electrode 51 and the gate pad 52*p* in the surface protection film 6.

Modification Example 4

Figure 23:
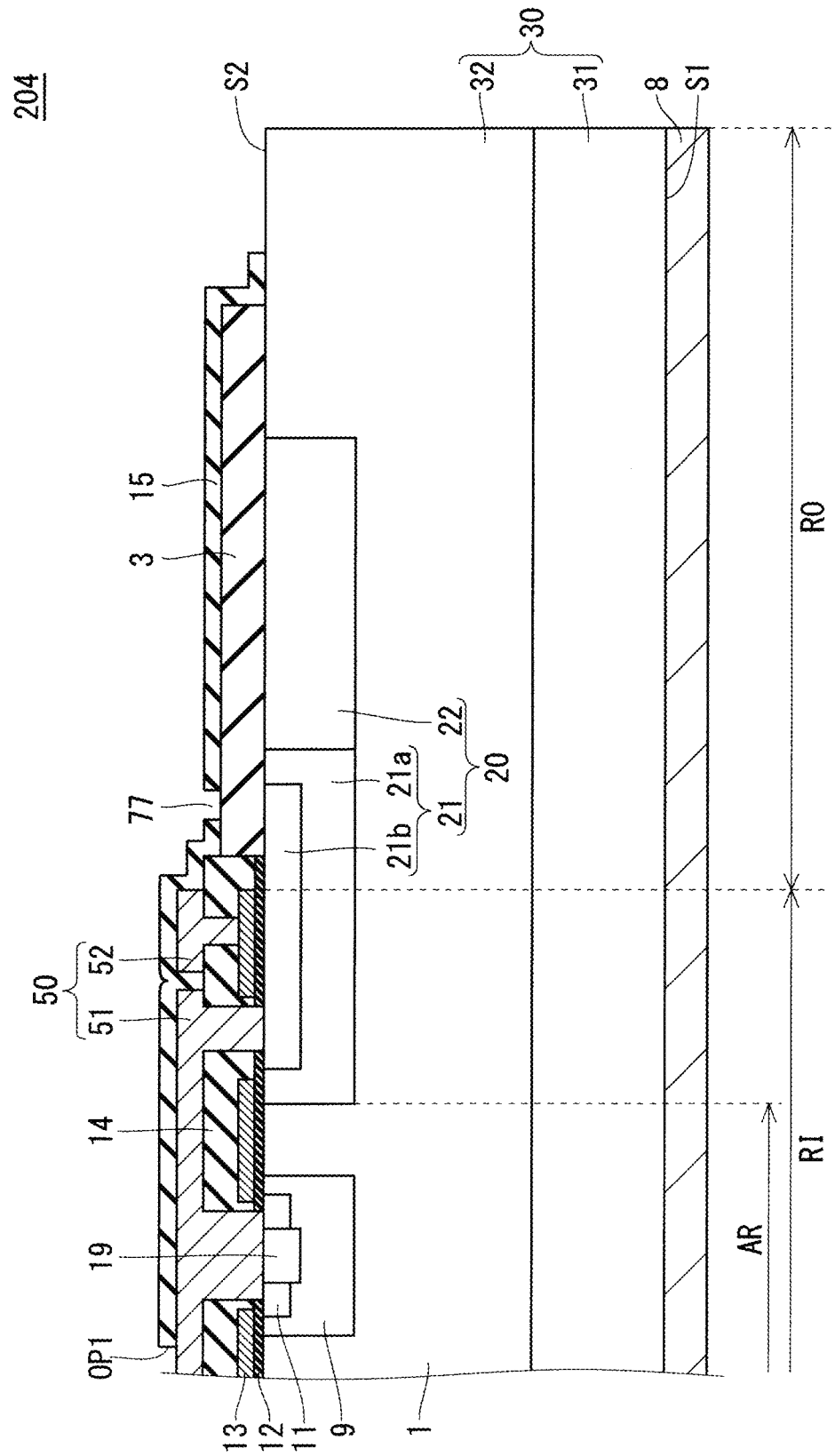
FIG. 23 A partial cross-sectional view illustrating a configuration of a modification example 4 of the semiconductor device of the embodiment 2 according to the present invention.

FIG. 23 is a cross-sectional view illustrating a configuration of a MOSFET 204 in a modification example 4 of the embodiment 2, and is a drawing corresponding to FIG. 17. As illustrated in FIG. 23, the MOSFET 204 includes the high resistance film 15 in place of the surface protection film 6 illustrated in FIG. 17. That is to say, the high resistance film 15 is provided to cover the source electrode 51 and the gate wiring electrode 52 on the end edge portion of the surface electrode 50 and at least part of the outer side region RO in the epitaxial substrate 30.

The high resistance film 15 has an outer peripheral opening part 77 reaching the field insulating film 3 in a position away from the surface electrode 5 in the outer side region RO. The outer peripheral opening part 77 is preferably provided to be located on the terminal well region 20. A material, a resistivity, and a thickness of the high resistance film 15 are the same as those of the high resistance film 15 in the embodiment 1.

Modification Example 5

Figure 24:
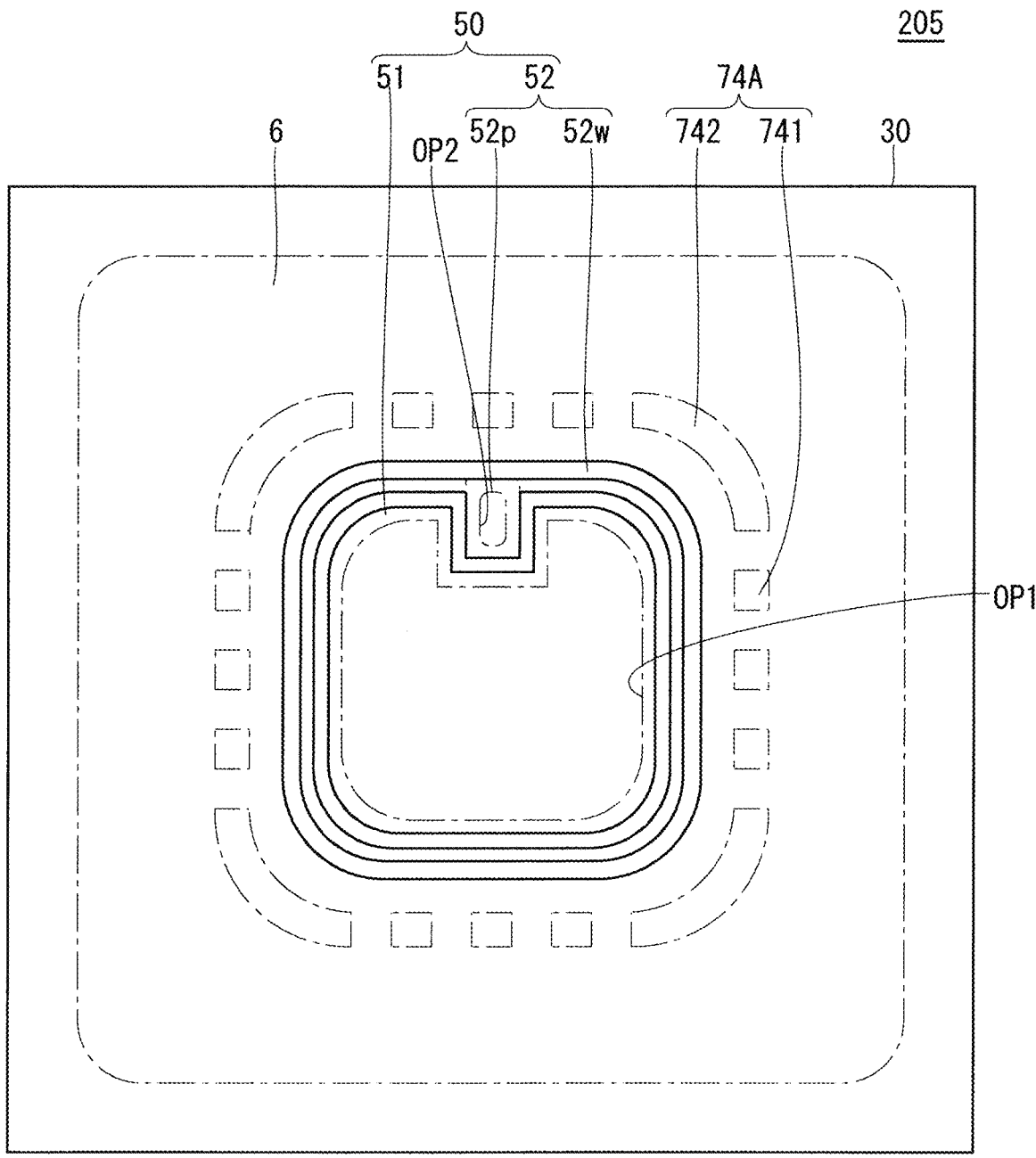
FIG. 24 A plan view illustrating a configuration of a modification example 5 of the semiconductor device of the embodiment 2 according to the present invention.

FIG. 24 is a plan view illustrating a configuration of a MOSFET 205 in a modification example 5 of the embodiment 2, and is a drawing corresponding to FIG. 18. As illustrated in FIG. 24, in the MOSFET 205, an outer peripheral opening part 74A provided to surround the surface electrode 50 is made up of a plurality of partial opening parts 741 and 742 which do not constitute a continuous opening part but are separated from each other. That is to say, the rectangular partial opening part 741 is provided in a straight portion along each side of the surface electrode 50, and the curved partial opening part 742 having a curvature is provided in a portion along a corner portion of the surface electrode 50, thereby having a configuration that the outer peripheral opening part 74A does not completely surround the surface electrode 50.

In other words, in the outer peripheral opening part 74 having a looped shape to completely surround the surface electrode 50 as illustrated in FIG. 17, a portion between an inner periphery and an outer periphery of the loop is embedded by the surface protection film 6 at one or more positions.

Herein, a portion which is not an opening part but is provided with the surface protection film 6 such as a portion between the partial opening parts 741 and a portion between the partial opening part 741 and the partial opening part 742 illustrated in FIG. 24 is defined as "a continuous region". It is preferable that the continuous region is not provided but the partial opening part 742 is provided in the portion along the corner portion of the surface electrode 50 having the curvature in a plan view.

Modification Example 6

Figure 25:
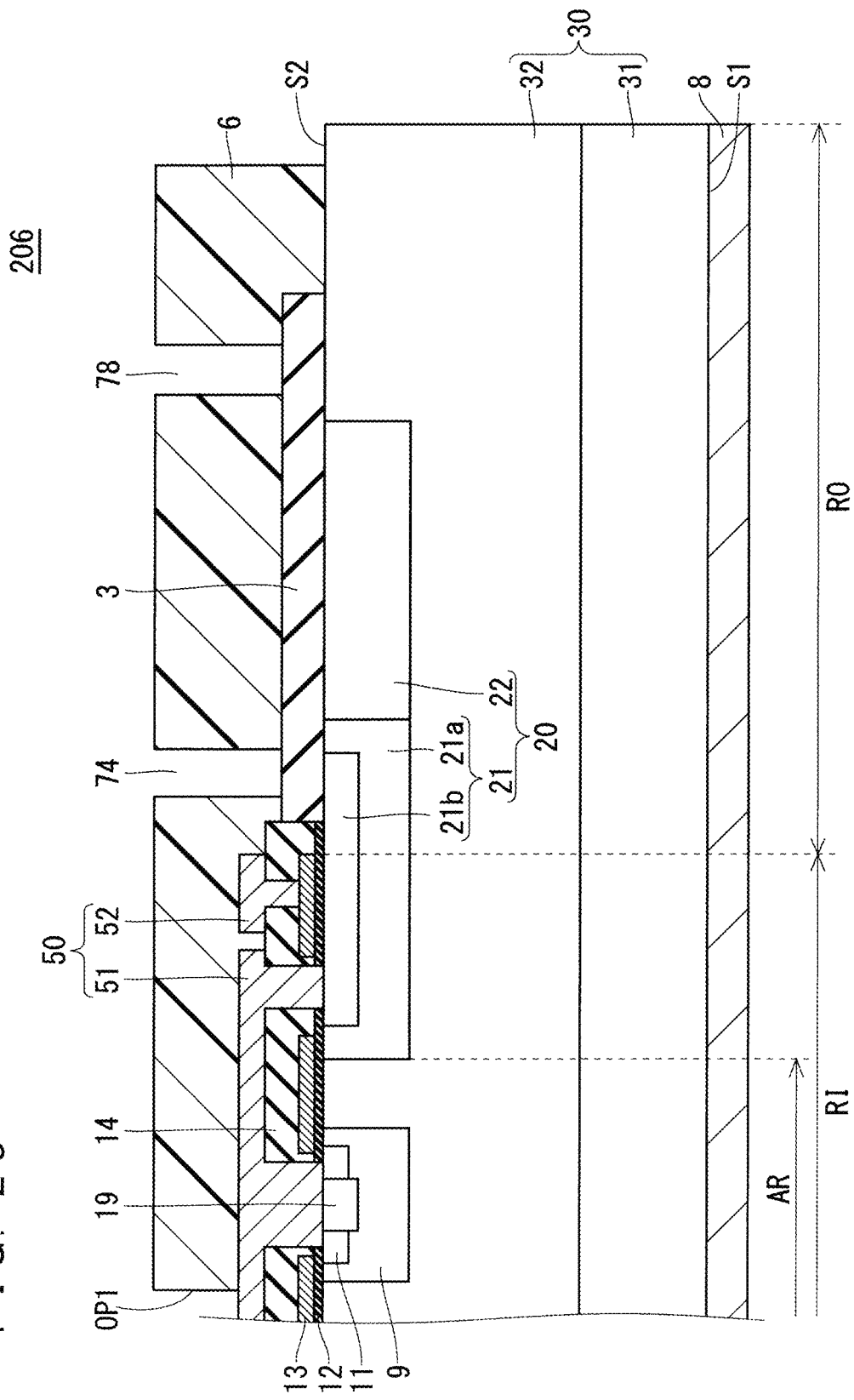
FIG. 25 A partial cross-sectional view illustrating a configuration of a modification example 6 of the semiconductor device of the embodiment 2 according to the present invention.

FIG. 25 is a plan view illustrating a configuration of a MOSFET 206 in a modification example 6 of the embodiment 2, and is a drawing corresponding to FIG. 18. As illustrated in FIG. 25, the MOSFET 206 includes an outer peripheral opening part 78 (second outer peripheral opening part) provided inside the outer end surface of the field insulating film 3 in the surface protection film 6 in addition to the outer peripheral opening part 74 (first outer peripheral opening part) of the MOSFET 200 described using FIG. 17.

In FIG. 25, based on an assumption of a maximum depletion layer extending from the boundary between the drift layer 1 and the terminal well region 20 in a case where maximum voltage is applied to the MOSFET 206, the outer peripheral opening part 78 is preferably provided on an outer side, that is to say, the right side in FIG. 25 away from the region where the maximum depletion layer reaches (is exposed to) the front surface S2 of the epitaxial substrate 30.

Operation

An operation of the MOSFET 200 of the embodiment 2 described using FIG. 17 is divided into two states and described next.

A first state is a state where positive voltage equal to or larger than a threshold value is applied to the gate electrode 13, and is referred to as "ON state" hereinafter. In the ON state, an inversion channel is formed in a channel region. The inversion channel functions as a path for electrons as carriers flowing between the source region 11 and the drift layer 1. In the ON state, when high voltage is applied to the back surface electrode 8 based on the source electrode 51 as a standard, current passing through the single crystal substrate 31 and the drift layer 1 flows. Voltage between the source electrode 51 and the back surface electrode 8 at this time and current flowing therein are referred to as ON voltage and ON current, respectively. The ON current flows only in the active region AR including channel, and does not flow the terminal region outside the active region AR.

A second state is a state where voltage smaller than a threshold value is applied to the gate electrode 13, and is referred to as "OFF state" hereinafter. In the OFF state, an inversion channel is not formed in a channel region, thus the ON current does not flow. Thus, when high voltage is applied between the source electrode 51 and the back surface electrode 8, this high voltage is maintained. At this time, the voltage between the gate electrode 13 and the source electrode 51 is significantly small compared with the voltage between the source electrode 51 and the back surface electrode 8, thus the high voltage is also applied between the gate electrode 13 and the back surface electrode 8.

Also in the terminal region outside the active region AR, the high voltage is applied between the gate wiring electrode 52 and the back surface electrode 8 and between the gate electrode 13 and the back surface electrode 8. An electrical contact with the source electrode 51 is formed in the boundary region 21 in the terminal well region 20 as with a case where an electrical contact with the source electrode 51 is formed in the element well region 9 in the active region AR, thus prevented is that a high electrical field is applied to the gate insulating film 12 and the interlayer insulating film 14.

The terminal region outside the active region AR operates in the manner similar to the ON state described in the embodiment 1. That is to say, the high electrical field is applied near the pn junction interface between the drift layer 1 and the terminal well region 20, and when voltage exceeding a critical electrical field is applied to the back surface electrode 8, avalanche breakdown occurs. Normally, rated voltage is determined so that the MOSFET 200 is used within a range in which the avalanche breakdown does not occur.

In the OFF state, the depletion layer expands in a direction (lower direction) toward the single crystal substrate 31 and an outer peripheral direction (right direction) of the drift layer 1 from the pn junction interface between the drift layer 1 and the element well region 9 and between the drift layer 1 and the terminal well region 20.

Considered herein is a case where the MOSFET 200 is in the OFF state under high humidity. The surface protection film 6 has high water absorption properties, thus contains a large amount of moisture under high humidity. This moisture reaches a surface of each of the field insulating film 3, the interlayer insulating film 14, and the surface electrode 50. Herein, an outer periphery side of the drift layer 1 acts as a positive electrode by voltage applied to the MOSFET 200, and the surface electrode 50 acts as a negative electrode. A reduction reaction of oxygen and a formation reaction of hydrogen occur as described in the above embodiment 1 near the surface electrode 50 which becomes the negative electrode. According to these reactions, a concentration of hydroxide ion increases near the surface electrode 50. When negative voltage is applied to the gate wiring electrode 52, the concentration of hydroxide ion further increases. Hydroxide ion chemically reacts with the surface electrode 50, thus an insulating material is deposited on an upper surface and a lateral surface of the surface electrode 50 in the outer end edge portion of the surface electrode 50, that is to say, a right end in FIG. 17.

The surface protection film 6 is pushed up by the deposition, and as a result, a peeling occurs at an interface between the surface electrode 50 and the surface protection film 6 in some cases. The peeling of the surface protection film 6 extends on the interlayer insulating film 14 and the field insulating film 3 in some cases. In other words, the peeling may also occur at the interface between the interlayer insulating film 14 and the surface protection film 6 and between the field insulating film 3 and the surface protection film 6.

This peeling occurs more significantly when the gate wiring electrode 52 to which the negative voltage is applied is formed to surround the active region AR. If a cavity portion is formed on the terminal well region 20 by this peeling, moisture enters the cavity portion and causes an excess leakage current flowing between the drain and the gate or between the drain and the source, or an aerial discharge occurs in the cavity portion, thus an element breakdown occurs in the MOSFET 200 in some cases.

If a cavity portion is formed between the source electrode 51 and the gate wiring electrode 52 by the peeling of the surface protection film 6, moisture enters the cavity portion and causes an excess leakage current flowing between the source and the gate in some cases.

However, in the MOSFET 200 of the present embodiment 2, the outer peripheral opening part 74 continuously formed into the looped form is provided outside the surface electrode 50. Accordingly, it is possible to prevent the peeling of the surface protection film 6 occurring from the end edge portion of the surface electrode 50 toward the end edge portion of the drift layer 1 from further extending outside the outer peripheral opening part 74.

The similar effect is also obtained in the MOSFET 201 illustrated in FIG. 20. Also in a case where the outer peripheral opening part 75 is provided between the source electrode 51 and the gate wiring electrode 52, the extension of peeling of the surface protection film 6 further outside the outer peripheral opening part 74 can be prevented.

When the outer peripheral opening part 75 is provided, the extension of peeling of the surface protection film 6 occurring from one of the source electrode 51 and the gate wiring electrode 52 beyond the outer peripheral opening part 75 is prevented.

When the surface protection film 6 remains in the outer peripheral opening part 75 to divide the side of the source electrode 51 and the side of the gate wiring electrode 52 in the outer peripheral opening part 75 as with the MOSFET 202 illustrated in FIG. 21, prevented is a connection of the peeling of the surface protection film 6 occurring from both the source electrode 51 and the gate wiring electrode 52 in the outer peripheral opening part 75.

Generally, the electrical field tends to be particularly concentrated near the pn junction in the semiconductor, and in the MOSFET 202 of the present embodiment 2, the electrical field tends to be concentrated near the pn junction formed by the drift layer 1 and the terminal well region 2. Accordingly, the electrical field tends to be concentrated near an outer end edge portion (a right end in FIG. 17) of the terminal well region 20 on the front surface S2. Thus, a high electrical field region tends to occur on the field insulating film 3 around the outer end edge portion of the terminal well region 20. If the peeling of the surface protection film 6 extends to this high electrical field region, an aerial discharge occurs easily. When the outer peripheral opening part 74 is located inside (the left side) the outer end surface of the terminal well region 20, the extension of peeling of the surface protection film 6 to the high electrical field region described above is prevented. Thus, the aerial discharge caused by the peeling described above can be avoided. The same applies to the outer peripheral opening part 76 of the MOSFET 203 illustrated in FIG. 22.

The outer peripheral opening parts 74 and 76 are preferably located inside (the left side) the outer end surface of the high concentration region 21b in the terminal well region 20. Accordingly, the depletion layer expanding inside the terminal well region 20 from the pn junction between the drift layer 1 and the terminal well region 20 in the OFF state hardly reaches the outer end edge portion of the outer peripheral opening parts 74 and 76.

As described in the embodiment 1, the electrical field tends to be concentrated in the region where the maximum depletion layer is exposed to the surface of the epitaxial substrate 30 on the front surface S2. If the peeling of the surface protection film 6 extends to this high electrical field region, an aerial discharge occurs easily. The outer peripheral opening parts 74 and 76 are provided to be located on the terminal well region 20 away from the region where the maximum depletion layer is exposed to the surface of the epitaxial substrate 30, thus the extension of peeling of the surface protection film 6 to the high electrical field region described above is prevented. Thus, the aerial discharge caused by the peeling of the surface protection film 6 can be avoided.

The similar effect is also obtained in the modification examples 4 to 6 of the embodiment 2. That is to say, with reference to FIG. 23, when the high resistance film 15 is provided in place of the surface protection film 6 as with the MOSFET 204, a potential gradient occurs by current flowing in the high resistance film 15 further inside the region where the maximum depletion layer is exposed to the surface of the epitaxial substrate 30, and the high electrical field tends to occur in an outer end edge portion of the surface electrode 50. At this time, the insulating material is deposited more easily on the outer end edge portion of the source electrode 51 and the gate wiring electrode 52. The high resistance film 15 is located on the upper side of the field insulating film 3 and the outer peripheral opening part 77 is provided, thus current flowing to the high resistance film 15 from the outer peripheral portion of the field insulation film 3 to which the drift layer 1 and the high resistance film 15 are connected can be suppressed, and the electrical field concentration in the end portion of the surface electrode 50 can also be suppressed. Furthermore, even if the insulating material is still deposited, the extension of peeling of the high resistance film 15 can be prevented by the outer peripheral opening part 77.

When the surface protection film 6 is provided on the high resistance film 15, there is a possibility that the insulating material deposited on the upper surface and the lateral surface of the surface electrode 50 causes the occurrence of peeling of both the high resistance film 15 and the surface protection film 6. Thus, when at least one of the outer peripheral opening part 77 passing through the high resistance film 15 and the outer peripheral opening part 74 (FIG. 17) passing through the surface protection film 6 is provided, the extension of peeling of the high resistance film 15 and the surface protection film 6 can be suppressed. It is obvious that the outer peripheral opening prat 75 of the modification example 1 or the outer peripheral opening part 75 of the modification example 3 may be provided in place of the outer peripheral opening part 74.

With reference to FIG. 24, when the outer peripheral opening part 74A provided to surround the surface electrode 50 as with the MOSFET 205 is made up of the plurality of partial opening parts 741 and 742 which do not constitute a continuous opening part but are separated from each other, the extension of peeling of the surface protection film 6 can be suppressed, and the peeling of the surface protection film 6 in one of the inner end edge portion and the outer end edge portion caused by the stress occurring in a thermal processing in a process of manufacturing the semiconductor device, for example, can be suppressed. That is to say, the outer peripheral opening part 74A is not the continuous opening part but is made up of the plurality of partial opening parts 741 and 742, thus intensity of the surface protection film 6 is secured by the continuous region, and the peeling caused by the stress can be suppressed.

An electrical field concentration generally tends to occur near the corner portion of the surface electrode 50 having the curvature in a plan view, and the insulating material is deposited more easily on the upper surface and the lateral surface of the surface electrode 50. Thus, the continuous region is not provided but the partial opening part 742 is provided in the portion along the corner portion of the surface electrode 50 in a plan view, thus the extension of peeling of the surface protection film 6 caused by the deposited insulating material is suppressed.

It is obvious that the outer peripheral opening parts 75 and 76 of the modification examples 1 and 3 may be made up of not a continuous opening part but a plurality of partial opening parts separated from each other.

There is a possibility that the epitaxial layer 32 and moisture react with each other outside the outer end edge portion of the field insulating film 3, and $SiO_2$ is deposited and the surface protection film 6 is peeled.

Thus, when the outer peripheral opening part 78 passing through the surface protection film 6 is provided near the outer end edge portion of the field insulating film 3 as with the MOSFET 205 described using FIG. 25, the extension of peeling of the surface protection film 6, which occurs near the outer end edge portion of the field insulating film 3, further inside the outer peripheral opening part 78 can be prevented even in a case where $SiO_2$ is deposited near the outer end edge portion of the field insulating film 3.

When the outer peripheral opening part 78 is located outside (the right side in FIG. 25) the region where the maximum depletion layer is exposed to the surface of the epitaxial substrate 30, the extension of peeling of the surface protection film 6 to the region described above is prevented. Thus, increase in a leakage current and the aerial discharge caused by the peeling of the surface protection film 6 can be avoided.

Manufacturing Method

Next, a method of manufacturing the MOSFET 200 of the embodiment 2 is described using FIG. 26 to FIG. 33 which are cross-sectional views each illustrating a manufacturing process in series.

Firstly, in the process illustrated in FIG. 9, the low-resistance single crystal substrate 31 including an n-type impurity at a relatively high concentration (n+) is prepared as with the case in the embodiment 1. The single crystal substrate 31 is an SiC substrate having a polytype of 4H, and has an off angle of four degrees or eight degrees.

Next, SiC is epitaxially grown on the single crystal substrate 31, and the n-type epitaxial layer 32 having an impurity concentration equal to or larger than $1\times10^{14}/cm^3$ and equal to or smaller than $1\times10^{17}/cm^3$ is formed to obtain the epitaxial substrate 30.

Figure 26:
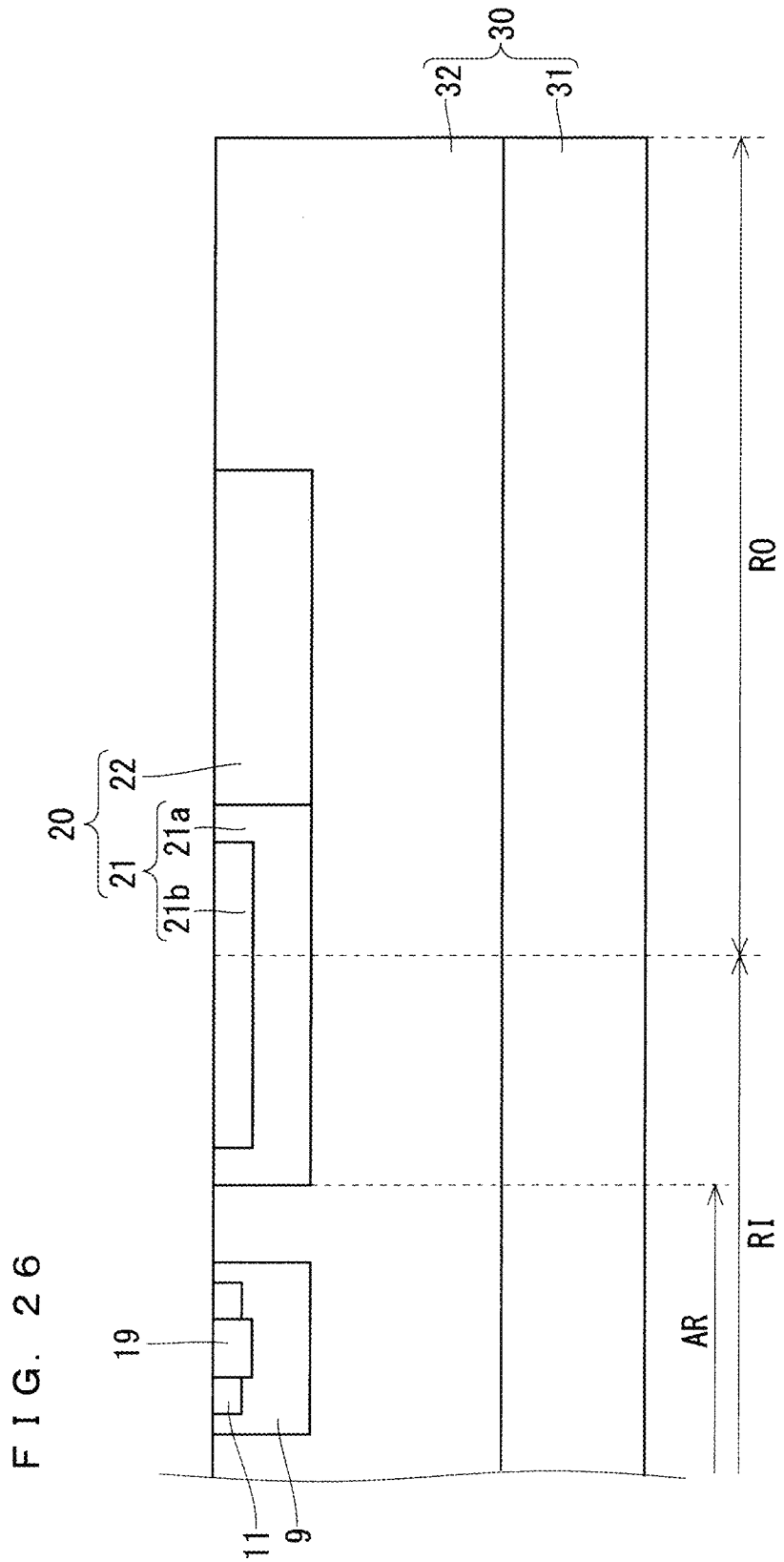
FIG. 26 A partial cross-sectional view illustrating a process of manufacturing the semiconductor device of the embodiment 2 according to the present invention.

Next, in a process illustrated in FIG. 26, a process of forming an impurity region on the upper layer portion of the epitaxial layer 32 by combining a process of forming a resist mask by a photolithography process and an ion-implantation process using the resist mask as am implantation mask is performed repeatedly, thereby forming the terminal well region 20, the element well region 9, the contact region 19, and the source region 11 on the upper layer portion of the epitaxial layer 32.

In the ion implantation, nitrogen (N), for example, is used as the n-type impurity, and Al or B, for example, is used as the p-type impurity. The element well region 9 and the low concentration region 21a in the terminal well region 20 can be collectively formed. The contact region 19 and the high concentration region 21b in the terminal well region 20 can be collectively formed.

The impurity concentration of each of the element well region 9 and the low concentration region 21a in the terminal well region 20 is equal to or larger than $1.0\times10^{18}/cm^3$ and equal to or smaller than $1.0\times10^{20}/cm^3$. The impurity concentration of the source region 11 is equal to or larger than $1.0\times10^{19}/cm^3$ and equal to or smaller than $1.0\times10^{21}/cm^3$, and is set higher than that of the element well region 9. A dose amount of the contact region 19 and the extension region 22 in the terminal well region 20 is preferably equal to or larger than $0.5\times10^{13}/cm^2$ and equal to or smaller than $5\times10^{13}/cm^2$, and is $1.0\times10^{13}/cm^2$, for example.

In the case where Al is ion-implanted, implantation energy of ion implantation is equal to or larger than 100 keV and equal to or smaller than 700 keV, for example. In this case, the impurity concentration of the extension region 22 converted from the dose amount [$cm^{-2}$] described above is equal to or larger than $1\times10^{17}/cm^3$ and equal to or smaller than $1\times10^{19}/cm^3$. In the case where N is ion-implanted, implantation energy of ion implantation is equal to or larger than 20 keV and equal to or smaller than 300 keV, for example.

Subsequently, annealing is performed at a temperature of 1500° C. or more. Accordingly, the impurity added by the ion implantation is activated.

Figure 27:
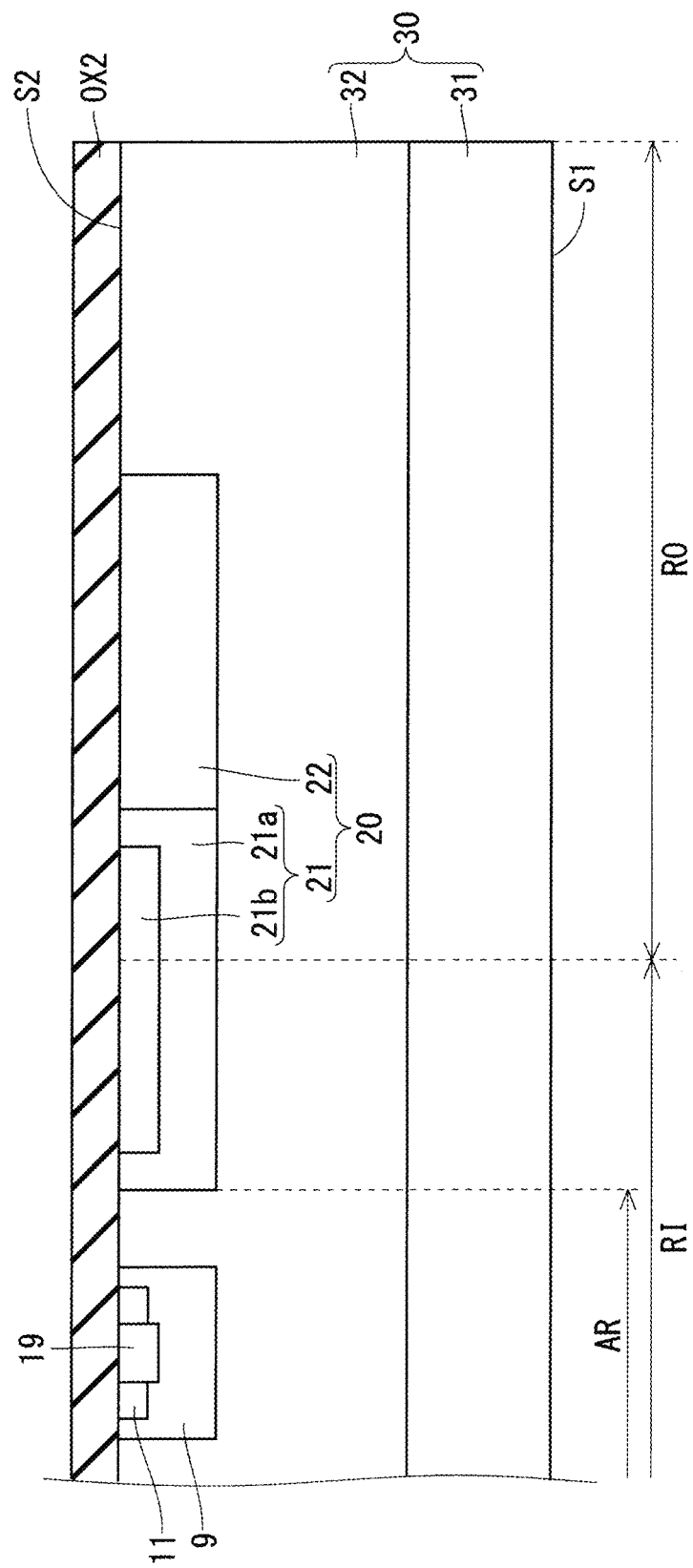
FIG. 27 A partial cross-sectional view illustrating the process of manufacturing the semiconductor device of the embodiment 2 according to the present invention.

Next, in a process illustrated in FIG. 27, an $SiO_2$ film OX2 having a thickness equal to or larger than 0.5 μm and equal to or smaller than 2 μm is formed on the front surface S2 of the epitaxial substrate 30 by CVD method, for example.

Figure 28:
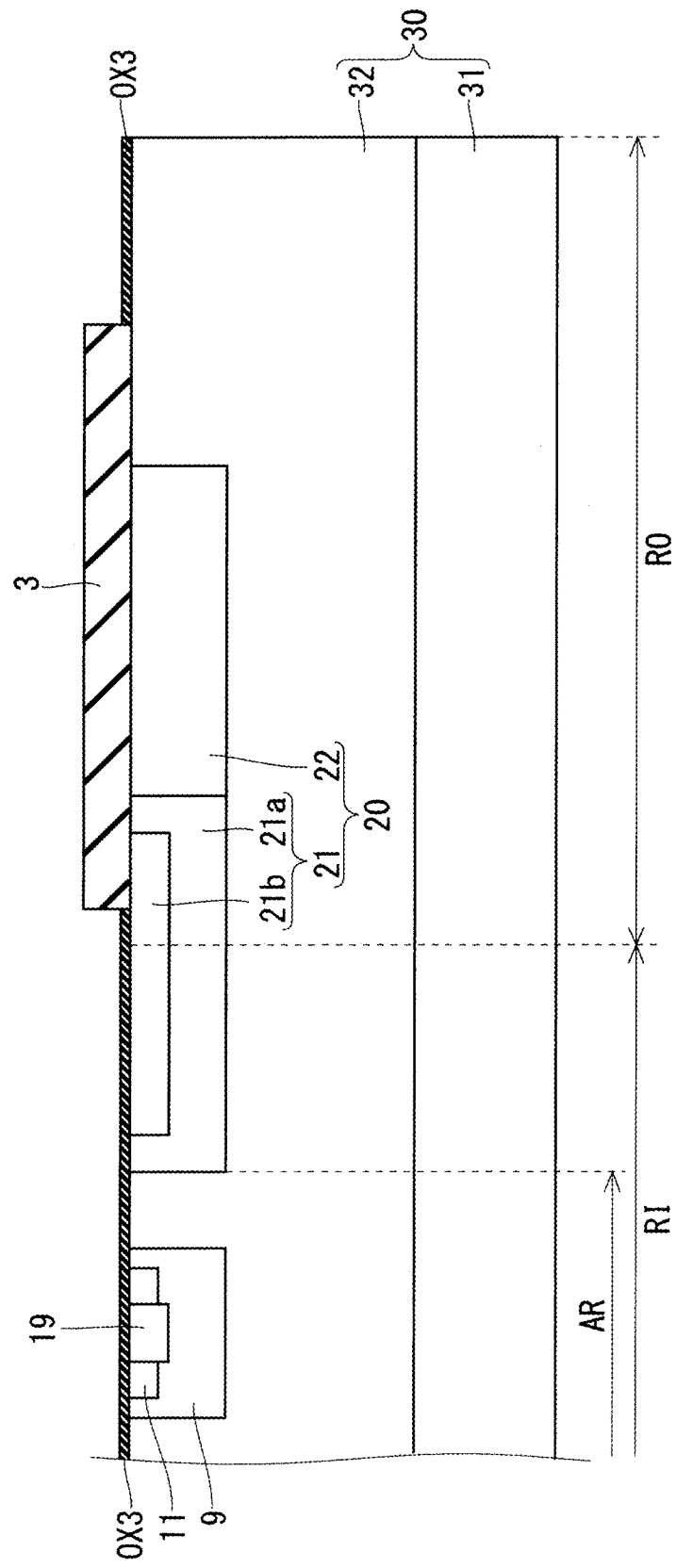
FIG. 28 A partial cross-sectional view illustrating the process of manufacturing the semiconductor device of the embodiment 2 according to the present invention.

Next, in a process illustrated in FIG. 28, the $SiO_2$ film OX2 is patterned by a photolithography process and an etching process to form the field insulating film 3 on the front surface S2 of the epitaxial substrate 30. At this time, the patterning is performed so that the field insulating film 3 extends to the inner side region RI from the boundary between the inner side region RI and the outer side region RO on the epitaxial layer 32, extends to the outer side region RO, and further extends beyond an end portion of the terminal well region 20 in the outer side region RO.

Subsequently, the surface of the epitaxial layer 32 which is not covered by the field insulation film 3 is thermally oxidized to form an $SiO_2$ film OX3 which becomes the gate insulating film 12.

Figure 29:
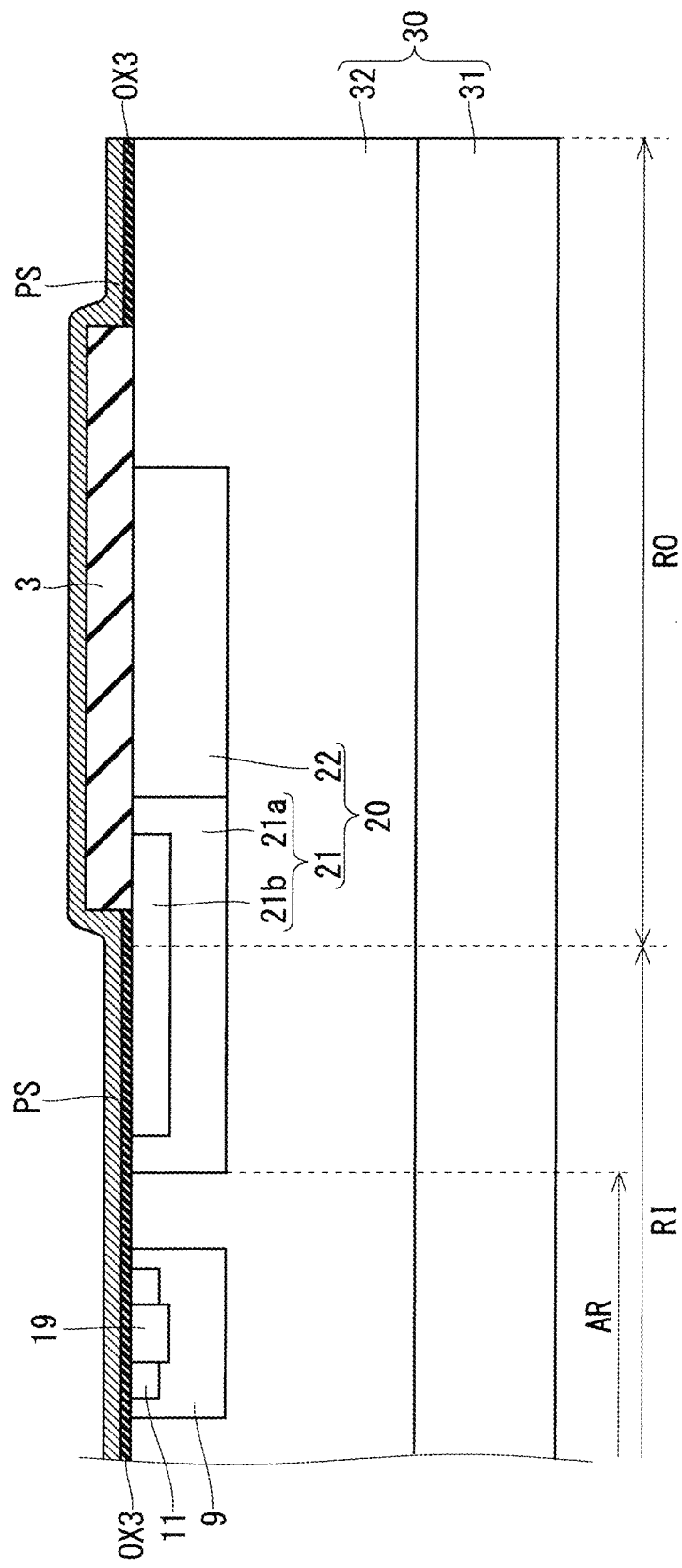
FIG. 29 A partial cross-sectional view illustrating the process of manufacturing the semiconductor device of the embodiment 2 according to the present invention.

Next, in a process illustrated in FIG. 29, a polycrystal silicon film PS having conductivity is formed on the gate insulating film 12 by CVD method.

Figure 30:
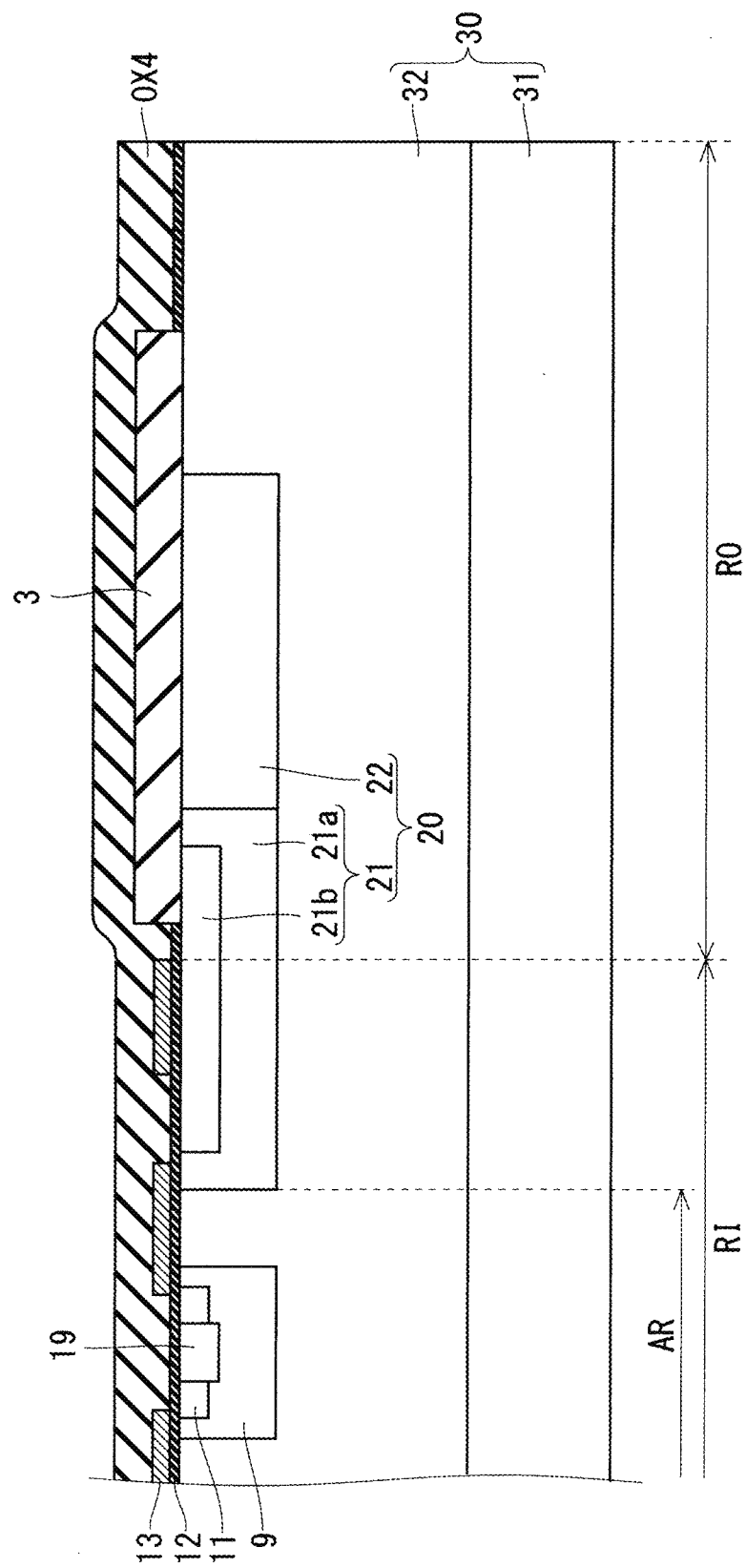
FIG. 30 A partial cross-sectional view illustrating the process of manufacturing the semiconductor device of the embodiment 2 according to the present invention.

Next, in a process illustrated in FIG. 30, the polycrystal silicon film PS is patterned by a photolithography process and an etching process to form the gate electrode 13. Subsequently, an $SiO_2$ film OX4 which becomes the interlayer insulating film 14 is formed by CVD method.

Figure 31:
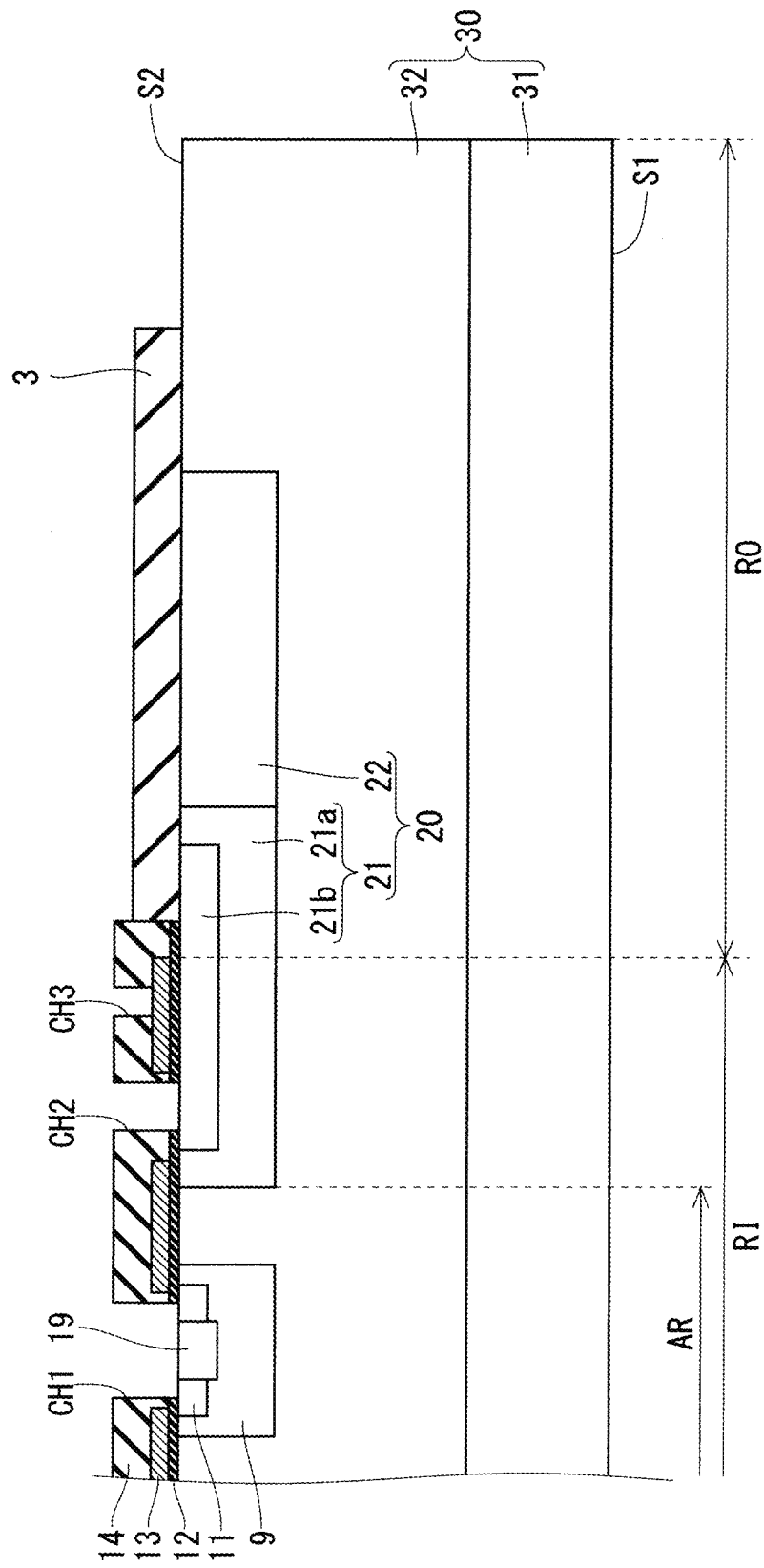
FIG. 31 A partial cross-sectional view illustrating the process of manufacturing the semiconductor device of the embodiment 2 according to the present invention.

Next, in a process illustrated in FIG. 31, contact holes CH1 and CH2 passing through the $SiO_2$ film OX4 and OX3 to reach the contact region 19 and the source region 11, respectively, are formed by a photolithography process and an etching process. At the same time, a contact hole CH3 passing through the interlayer insulating film 14 to reach the gate electrode 13 is formed outside the active region AR. The $SiO_2$ films OX4 and OX3 are removed from the upper side of the field insulating film 3 and the end edge portion of the epitaxial layer 32.

Figure 32:
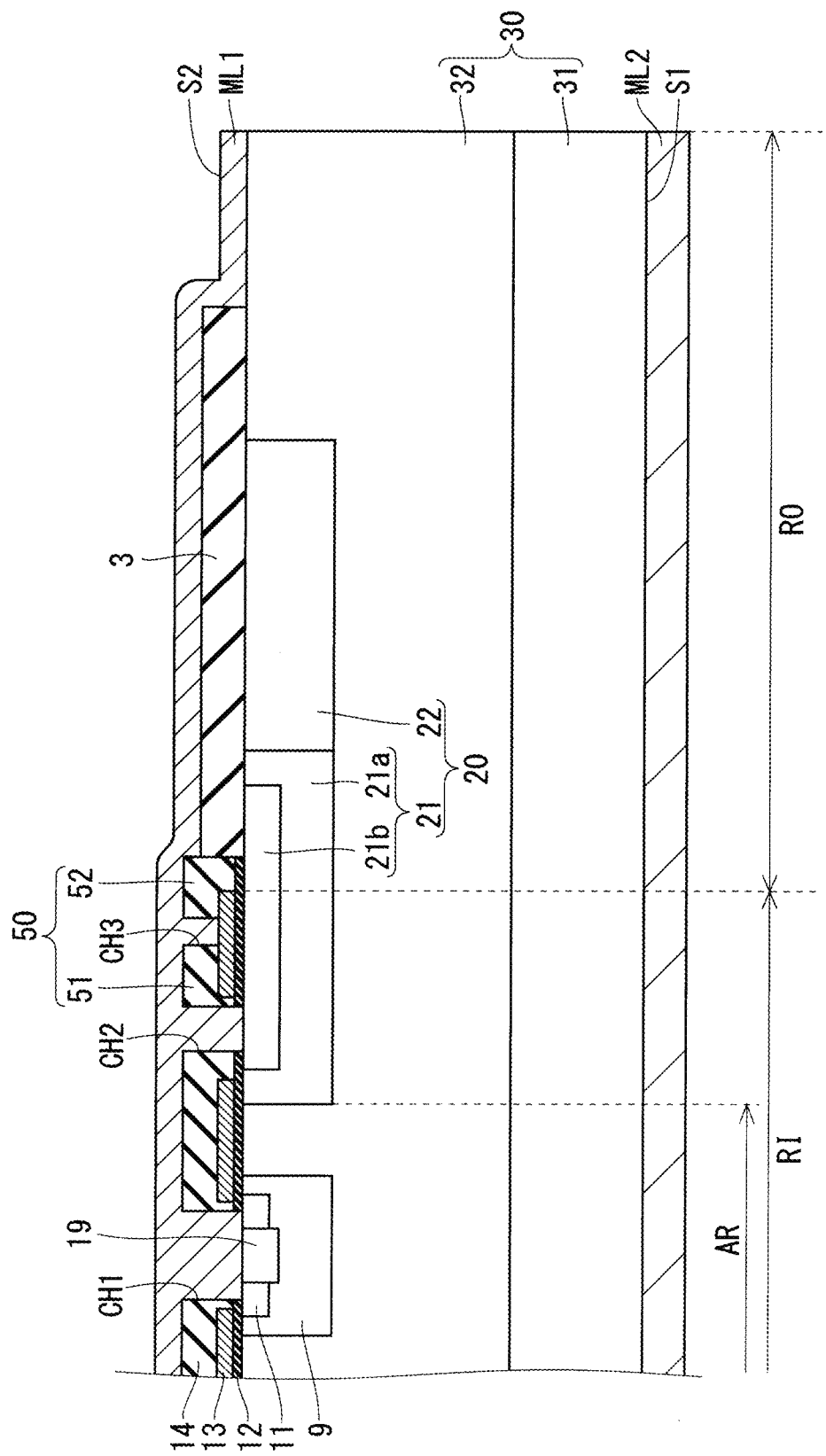
FIG. 32 A partial cross-sectional view illustrating the process of manufacturing the semiconductor device of the embodiment 2 according to the present invention.

Next, in a process illustrated in FIG. 32, a material layer ML1 of the surface electrode 50 is formed on the front surface S2 of the epitaxial substrate 30 by sputtering method or evaporation method, and a material layer ML2 of the back surface electrode 8 is formed on the back surface S1 of the epitaxial substrate 30 by the similar method.

Metal including one or some of Ti, Ni, Al, Cu, and Au or Al alloy such as Al—Si, for example, is used for forming the material layer ML1. Metal including one or some of Ti, Ni, Al, Cu, and Au, for example, is used for forming the material layer ML2. A silicide film may be formed on a portion where the material layer ML1 and the material layer ML2 have contact with the epitaxial substrate 30 in advance by thermal processing.

Figure 33:
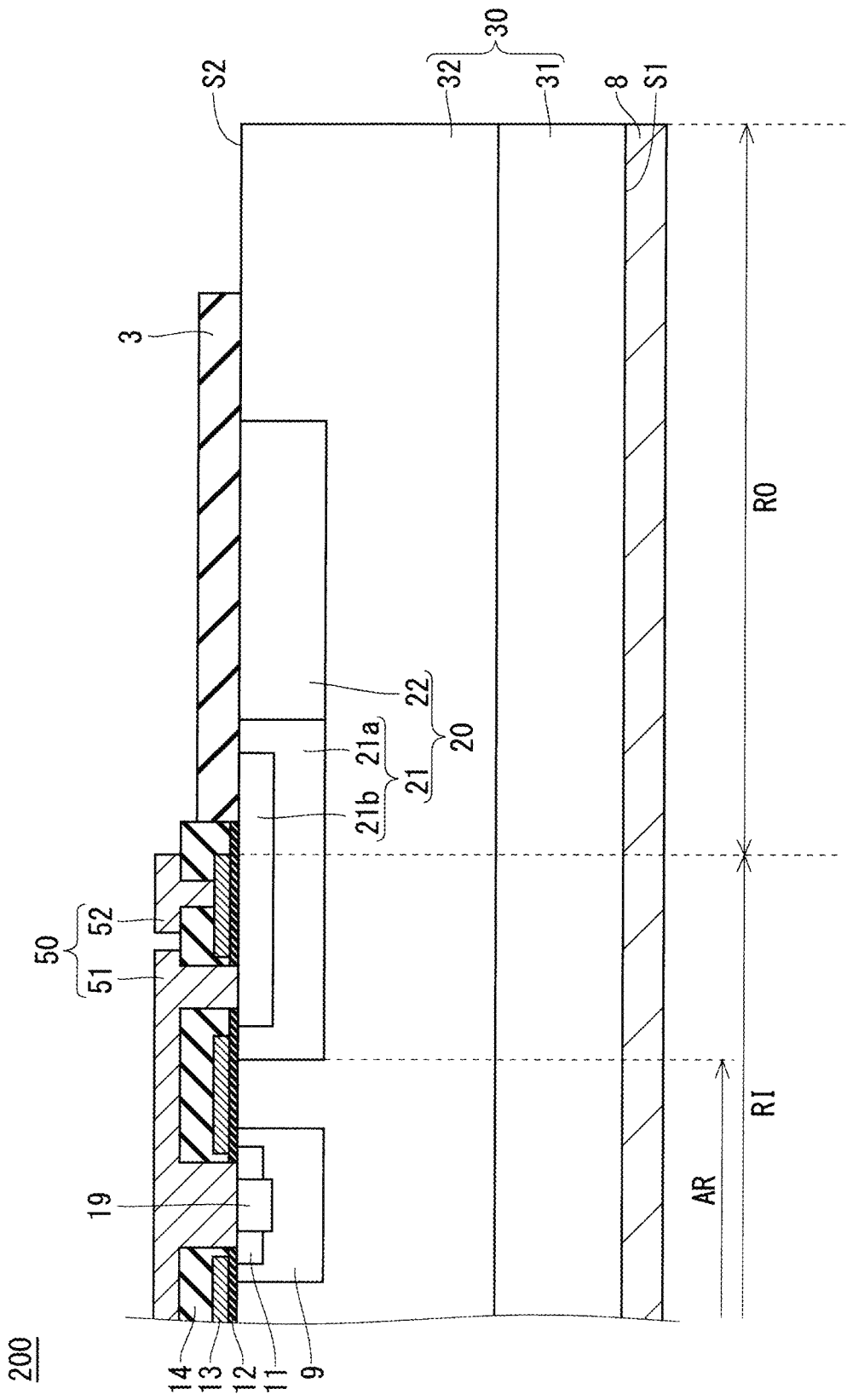
FIG. 33 A partial cross-sectional view illustrating the process of manufacturing the semiconductor device of the embodiment 2 according to the present invention.

Next, in a process illustrated in FIG. 33, the material layer ML1 is patterned by a photolithography process and an etching process to form the surface electrode 50, and the material layer ML1 is removed from the upper side of the field insulating film 3 and the end edge portion of the epitaxial layer 32. The material layer ML2 becomes the back surface electrode 8. The material layer ML2 may be formed at the end of all of the processes.

Finally, the surface protection film 6 is formed to cover the end edge portion of the surface electrode 50 and at least part of the outer side region RO in the epitaxial substrate 30 to obtain the MOSFET 200 illustrated in FIG. 17.

The surface protection film 6 is formed into a desired shape by applying and exposing photoactive polyimide. At this time, the patterning is performed so that the surface protection film 6 is not formed in the region where the outer peripheral opening part 74 is formed. The outer peripheral opening parts 75, 76, 74A, and 78 of the MOSFETs 201 to 203, 205, and 206 may also be formed by patterning.

Herein, when the MOSFET 204 described using FIG. 23 is manufactured, an SiN film is formed on the front surface S2 of the epitaxial substrate 30 where the surface electrode 50 is provided by plasma chemical vapor deposition (CVD) method, for example, subsequent to the process described using FIG. 33. In this process, a ratio of Si and N is adjusted, thus a resistivity of the SiN film can be adjusted. Next, the SiN film is patterned by a photolithography process and an etching process to form the high resistance film 15 illustrated in FIG. 23. At this time, the SiN film is patterned so that the outer peripheral opening part 77 is formed in a predetermined position on the terminal well region 20 away from the surface electrode 50. A thickness of the high resistance film 15 is preferably equal to or larger than 100 nm, and is 1 μm, for example.

<Outline>

According to the configurations of the embodiment 2 and the modification example thereof described above, the extension of peeling of the surface protection film 6 beyond the outer peripheral opening parts 74, 75, 76, 74A, and 77 is prevented, thus insulation protection of the outer side region RO is maintained by the surface protection film 6 outside the outer peripheral opening parts 74, 76, 74A, and 77 and inside the outer peripheral opening part 78, and insulation reliability of the MOSFET can be increased. When the outer peripheral opening part 75 is provided, the insulation protection between the source electrode 51 and the gate wiring electrode 52 is maintained, and insulation reliability of the MOSFET can be increased.

Embodiment 3

The semiconductor device according to the embodiments 1 and 2 described above is applied to a power conversion device in the present embodiment. Described hereinafter is a case where the semiconductor device according to the embodiments 1 and 2 is applied to a three-phase inverter as an embodiment 3.

Figure 34:
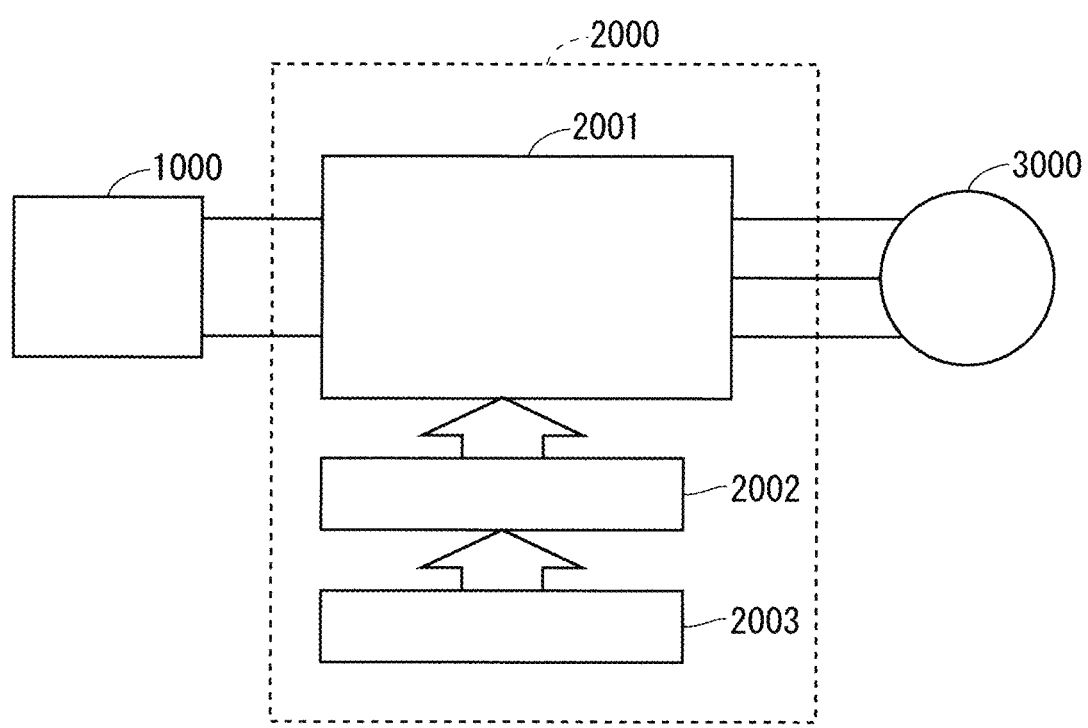
FIG. 34 A block diagram illustrating a configuration of a power conversion system to which a power conversion device of an embodiment 3 according to the present invention is applied.

FIG. 34 is a block diagram schematically illustrating a configuration of a power conversion system to which a power conversion device 2000 according to the present embodiment is applied.

A power conversion system illustrated in FIG. 34 includes a power source 1000, the power conversion device 2000, and a load 3000. The power source 1000 is a direct current power source, and supplies a direct current power to the power conversion device 2000. The power source 1000 can be made up of various components, thus can be made up of a direct current system, a solar battery, or a storage battery, for example, and may also be made up of a rectification circuit connected to an alternating current system or an AC/DC converter. The power source 1000 may also be made up of a DC/DC converter converting a direct current power being output from a direct current system into a predetermined power.

The power conversion device 2000 is a three-phase inverter connected between the power source 1000 and the load 3000, converts a direct current power supplied from the power source 1000 into an alternating current power, and supplies the alternating current power to the load 3000. As illustrated in FIG. 34, the power conversion device 2000 includes a main conversion circuit 2001 converting a direct current power into an alternating current power and outputting the alternating current power, a drive circuit 2002 outputting a drive signal for driving each switching element of the main conversion circuit 2001, and a control circuit 2003 outputting a control signal for controlling the drive circuit 2002 to the drive circuit 2002.

The load 3000 is a three-phase electrical motor driven by the alternating current power supplied from the power conversion device 2000. The load 3000 is not for a specific purpose of usage, but is an electrical motor mounted on various types of electrical equipments, thus is used as an electrical motor for a hybrid automobile, an electrical automobile, a railroad vehicle, an elevator, or an air-conditioning machine, for example.

Details of the power conversion device 200 are described hereinafter. The main conversion circuit 2001 includes a switching element and a freewheeling diode (not shown), and when the switching element is switched, the main conversion circuit 2001 converts the direct current power supplied from the power source 1000 into the alternating current power, and supplies the alternating current power to the load 3000. Examples of a specific circuit configuration of the main conversion circuit 2001 include various configurations, however, the main conversion circuit 2001 according to the present embodiment is a three-phase full-bridge circuit with two levels, and can be made up of six switching elements and six freewheeling diodes antiparallelly connected to each switching element. The semiconductor device according to any one of the embodiments 1 and 2 described above is applied to at least one of each switching element and each freewheeling diode of the main conversion circuit 2001. The six switching elements are connected two by two in series to constitute upper and lower arms, and each pair of the upper and lower arms constitutes each phase (U phase, V phase, and W phase) of a full-bridge circuit. Output terminals of the pair of the upper and lower arms, that is to say, three output terminals of the main conversion circuit 2001 are connected to the load 3000.

The drive circuit 2002 generates a drive signal for driving a switching element of the main conversion circuit 2001, and supplies the drive signal to a control electrode of the switching element of the main conversion circuit 2001. Specifically, the drive circuit 2002 outputs a drive signal for making the switching element enter an ON state and a drive signal for making the switching element enter an OFF state to a control electrode of each switching element in accordance with a control signal from the control circuit 2003 describe hereinafter. When the switching element is kept in the ON state, the drive signal is a voltage signal (ON signal) equal to or larger than a threshold voltage of the switching element, and when the switching element is kept in the OFF state, the drive signal is a voltage signal (OFF signal) equal to or smaller than the threshold voltage of the switching element.

The control circuit 2003 controls the switching element of the main conversion circuit 2001 so that a desired electrical power is supplied to the load 3000. Specifically, the control circuit 2003 calculates a time (on time) at which each switching element of the main conversion circuit 2001 should enter the ON state based on the electrical power to be supplied to the load 3000. For example, the control circuit 2003 can control the main conversion circuit 2001 by pulse width modulation (PWM) control modulating the on time of the switching element in accordance with the voltage to be output. Then, the control circuit 2003 outputs a control command (control signal) to the drive circuit 2002 so that the ON signal is output to the switching element which should enter the ON state and the OFF signal is output to the switching element which should enter the OFF state at each point of time. The drive circuit 2002 outputs the ON signal or the OFF signal as the drive signal to the control electrode of each switching element in accordance with the control signal.

The semiconductor device according to the embodiment 1 can be applied as a freewheeling diode of the main conversion circuit 2001 in the power conversion device according to the present embodiment. When the semiconductor device according to the embodiment 1 and the embodiment 2 is applied to the power conversion device 2000 in this manner, the semiconductor device is generally embedded in gel or resin in use, however, these materials cannot completely block moisture, thus the insulation protection of the semiconductor device is maintained by the configuration described in the embodiment 1 and the embodiment 2. The reliability can be thereby increased.

Described in the above present embodiment is the example of applying the present invention to the three-phase inverter with two levels. However, the present invention is not limited thereto, but can be applied to various power conversion devices. Described in the present embodiment is the power conversion device with two levels, but a power conversion device with three levels or a multilevel power conversion device may also be applied. When an electrical power is supplied to a single phase load, the present invention may be applied to a single-phase inverter. When the electrical power is supplied to a direct current load, for example, the present invention can be applied to a DC/DC converter or an AC/DC converter.

The power conversion device applying the present invention can be used not only in the case where the load is the electrical motor but can be used as a power source device of an electrical discharge machine, a laser beam machine, an induction heat cooking machine, or a wireless chagrining system, and further can also be used as a power conditioner of a solar power system or an electricity storage system, for example.

In each embodiment described above, material properties, materials, dimensions, shapes, relative arrangement relations, conditions for implementation, and so forth for the respective constituent elements may be described, however, these represent a mare example in all aspects, and are not limited to the description in the specification of the present application. Accordingly, it is understood that numerous other modification examples which are not exemplified can be devised without departing from the scope of the present invention.

For example, the following cases where optional constituent elements are to be modified, added, or omitted, further, at least one of the constituent elements of at least one of the embodiments is extracted and then combined with constituent elements of the other embodiment, are involved.

The "one" constituent element described in the above embodiments may be "one or more" constituent elements so far as consistent with the embodiments. Further, individual constituent elements are conceptual units. Thus, one constituent element may include multiple structures, and one constituent element may correspond to part of some structure. Each constituent element includes a structure having a different configuration or a different shape as long as the structure of the different configuration or the different shape achieves the same function.

According to the present invention, each embodiment can be arbitrarily combined, or each embodiment can be appropriately varied or omitted within the scope of the invention. Although the present invention is described in detail, the foregoing description is in all aspects illustrative and does not restrict the invention. It is therefore understood that numerous modifications and variations can be devised without departing from the scope of the invention. What has been described in the present specification is referred for all purposes of the present invention. It is thus not an admission that any of the descriptions provided herein are conventional techniques.

The invention claimed is:

1. A semiconductor device in which a main current flows in a thickness direction of a semiconductor substrate, wherein
the semiconductor substrate includes:
a semiconductor layer of a first conductivity type; and
a well region of a second conductivity type, which is different from the first conductivity type, provided on an upper layer portion of the semiconductor layer,
the semiconductor device includes:
a surface electrode provided on a second main surface on a side opposite to a first main surface;
a back surface electrode provided on the first main surface; and
an upper surface film covering an end edge portion of the surface electrode and at least part of an outer side region outside an end surface of the surface electrode of the semiconductor substrate,
the well region includes a portion extending to the outer side region and a portion extending to an inner side region inside the end surface of the surface electrode,
the surface electrode covers at least part of the inner side region and is electrically connected to the well region,
the upper surface film includes at least one outer peripheral opening part provided along an outer periphery of the surface electrode away from the surface electrode of the outer side region, and
the at least one outer peripheral opening part is provided inside an outer end surface of the well region.

2. The semiconductor device according to claim 1, further comprising
an insulating film provided on the second main surface of the semiconductor substrate, wherein
the insulating film is provided in the outer side region and the inner side region, and part of the end edge portion of the surface electrode is located on the insulating film, and
the at least one outer peripheral opening part is provided to reach the insulating film.

3. The semiconductor device according to claim 2, wherein
the at least one outer peripheral opening part includes:
a first outer peripheral opening part provided in a position relatively close to the surface electrode; and
a second outer peripheral opening part provided in a position relatively close to an outer end edge portion of the insulating film.

4. The semiconductor device according to claim 1, wherein
the well region includes:
a first region provided on the upper layer portion of the semiconductor layer; and
a second region provided on an upper layer portion of the first region and having an impurity concentration higher than an impurity concentration of the first region, and
the at least one outer peripheral opening part is provided inside an outer end surface of the second region.

5. The semiconductor device according to claim 1, wherein
in a case where a depletion layer extending from a boundary between the semiconductor layer and the well region at a time when maximum voltage is applied to the semiconductor device is defined as a maximum depletion layer,
the at least one outer peripheral opening part is provided away from a region where the maximum depletion layer reaches the second main surface.

6. The semiconductor device according to claim 1, wherein
the at least one outer peripheral opening part is made as a continuous opening part in a plan view.

7. The semiconductor device according to claim 1, wherein
the at least one outer peripheral opening part is made as a plurality of partial opening parts separated from each other in a plan view, and a portion between the plurality of partial opening parts constitutes a continuous region including the upper surface film.

8. The semiconductor device according to claim 7, wherein
the continuous region is provided in a portion other than a portion along a corner portion of the surface electrode having a curvature in a plan view.

9. The semiconductor device according to claim 1, wherein
the semiconductor layer is made up of a silicon carbide layer.

10. A semiconductor device in which a main current flows in a thickness direction of a semiconductor substrate, wherein
the semiconductor substrate includes:
a semiconductor layer of a first conductivity type; and
a well region of a second conductivity type, which is different from the first conductivity type, provided on an upper layer portion of the semiconductor layer,
the semiconductor device includes:
a surface electrode provided on a second main surface on a side opposite to a first main surface;
a back surface electrode provided on the first main surface; and
an upper surface film covering an end edge portion of the surface electrode and at least part of an outer side region outside an end surface of the surface electrode of the semiconductor substrate, the well region includes a portion extending to the outer side and a portion extending to an inner side region inside the end surface of the surface electrode, the surface electrode covers at least part of the inner side region and is electrically connected to the well region, and the upper surface film includes a one outer peripheral opening part provided along the surface electrode in a portion of the inner side region where the surface electrode is not provided.

11. The semiconductor device according to claim 10, wherein the outer peripheral opening part includes the upper surface film provided to divide an inner periphery side and an outer periphery side of the outer peripheral opening part in the outer peripheral opening part.

12. A power conversion device, comprising:
a main conversion circuit including the semiconductor device according to claim 1, and converting and outputting an electrical power being input to the main conversion circuit;
a drive circuit outputting a drive signal for driving the semiconductor device to the semiconductor device; and
a control circuit outputting a control signal for controlling the drive circuit to the drive circuit.

13. A power conversion device, comprising:
a main conversion circuit including the semiconductor device according to claim 9, and converting and outputting an electrical power being input to the main conversion circuit;
a drive circuit outputting a drive signal for driving the semiconductor device to the semiconductor device; and
a control circuit outputting a control signal for controlling the drive circuit to the drive circuit.

* * * * *